US010763297B1

(12) United States Patent
Tuan

(10) Patent No.: US 10,763,297 B1
(45) Date of Patent: Sep. 1, 2020

(54) OPTICAL SENSOR

(71) Applicant: INT TECH CO., LTD., Hsinchu County (TW)

(72) Inventor: Fu-Yuan Tuan, New Taipei (TW)

(73) Assignee: INT TECH CO., LTD., Hsinchu (TW)

( * ) Notice: Subject to any disclaimer, the term of this patent is extended or adjusted under 35 U.S.C. 154(b) by 0 days.

(21) Appl. No.: 16/428,226

(22) Filed: May 31, 2019

(51) Int. Cl.
*H01L 31/0224* (2006.01)
*H01L 27/146* (2006.01)
*G06F 3/042* (2006.01)

(52) U.S. Cl.
CPC ...... *H01L 27/14678* (2013.01); *G06F 3/0421* (2013.01); *H01L 27/1462* (2013.01); *H01L 27/14603* (2013.01); *H01L 27/14627* (2013.01); *H01L 27/14629* (2013.01); *H01L 27/14636* (2013.01); *H01L 27/14643* (2013.01); *H01L 27/14685* (2013.01); *H01L 27/14689* (2013.01)

(58) Field of Classification Search
CPC ............ H01L 27/323; H01L 31/02002; H01L 31/0224; H01L 31/0232
See application file for complete search history.

(56) References Cited

U.S. PATENT DOCUMENTS

| | | | | |
|---|---|---|---|---|
| 2007/0114532 A1* | 5/2007 | Yamazaki | ......... | H01L 29/78624 257/59 |
| 2010/0007632 A1* | 1/2010 | Yamazaki | ............... | G06F 21/32 345/175 |
| 2016/0104734 A1* | 4/2016 | Hirose | .............. | H01L 27/14616 257/43 |
| 2017/0207347 A1* | 7/2017 | Endo | ................... | H01L 29/7869 |

OTHER PUBLICATIONS

Toshiyoshi, Hiroshi & Kobayashi, M & Miyauchi, D & Fujita, Hiroyuki & Podlecki, Jean & Arakawa, Y. (1999). Design and analysis of micromechanical tunable interferometers for WDM free-space optical interconnection. Lightwave Technology, Journal of. 17. 19-25. 10.1109/50.737416.
Vladislav Jovanov, Jordan Ivanchev, and Dietmar Knipp, "Standing wave Spectrometer," Optics Express vol. 18, Issue 2, pp. 426-438 (2010).
"http://isl.stanford.edu/~abbas/ee392b/lect05.pdf", Lecture Note 5, CMOS Image Sensor Device and Fabrication, EE 392B: Device and Fabrication.
Mohamed M. Hilali, Sayan Saha, Emmanuel Onyegam, Rajesh Rao, Leo Mathew, and Sanjay K. Banerjee, "Light trapping in ultrathin 25 μm exfoliated Si solar cells," Appl. Opt. 53, 6140-6147 (2014).

(Continued)

*Primary Examiner* — Jae Lee
(74) *Attorney, Agent, or Firm* — WPAT, P.C., Intellectual Property Attorneys; Anthony King

(57) ABSTRACT

An optical sensor is provided. The optical sensor includes a substrate, a transistor, a dielectric layer, a first electrode, a photodiode, a second electrode and a gap. The transistor is disposed over the substrate. The dielectric layer is disposed over the transistor. The first electrode is disposed over the dielectric layer and includes a U-shaped portion electrically connected to the transistor. The second electrode is disposed over the first electrode, and the photodiode is disposed between the first electrode and the second electrode. The gap is surrounded by the U-shaped portion of the first electrode and is sealed by the first electrode or the second electrode.

20 Claims, 17 Drawing Sheets

(56) References Cited

OTHER PUBLICATIONS

Isozaki, A & Kuwana, Kenta & Tomimatsu, Yutaka & Itoh, T. (2011). Photodiode with micro texture for improving sensitivity at large angle of incidence for particle sensors. 2050-2053. 10.1109/TRANSDUCERS.2011.5969219.

"http://www.pitotech.com.tw/contents/zh-tw/p13450_8_3_%E5%BE%AE%E9%80%8F%E9%8F%A1%EF%BC%88microlens%EF%BC%89%E5%85%89%E5%AD%B8%E6%A8%A1%E6%93%AC%E4%B8%8A%E6%A9%9F%E5%AF%A6%E5%81%9A(%E6%96%B0%E7%AB%B9).html", Pitotech Co., Ltd., Taiwan.

"https://www.nani.com.tw/jlearn/natu/ability/a1/3_a1_4_1.htm", Light propagation and medium.

* cited by examiner

OPTICAL SENSOR

TECHNICAL FIELD

The present disclosure is related to a semiconductor structure, especially a structure of an optical sensor.

BACKGROUND

A touchscreen is an input and output device usually layered on the top of an electronic visual display. A user can enter input or control an information processing system by touching the screen with one or more fingers, a stylus or a special pen to substitute for (or use instead of) a mouse or a remote control. The touchscreen enables the user to interact directly with what is displayed, rather than using a mouse, a keyboard, or other such devices (other than a stylus, which is optional for most modern touchscreens). With easily-marketed features of easy portability, use and control, which is especially important for elder users and children, the touchscreen provides high convenience and has become a main product in the consumer display market.

SUMMARY

One aspect of the present disclosure provides an optical sensor. The optical sensor includes a substrate, a transistor, a dielectric layer, a first electrode, a photodiode, a second electrode and a gap. The transistor is disposed over the substrate. The dielectric layer is disposed over the transistor. The first electrode is disposed over the dielectric layer and includes a U-shaped portion electrically connected to the transistor. The second electrode is disposed over the first electrode, and the photodiode is disposed between the first electrode and the second electrode. The gap is surrounded by the U-shaped portion of the first electrode and sealed by the first electrode or the second electrode.

In an embodiment of the present disclosure, the photodiode and a portion of the second electrode line the U shaped portion of the first electrode, and the gap is sealed by the second electrode.

In an embodiment of the present disclosure, the second electrode includes a first portion, lining the photodiode and the U-shaped portion of the first electrode; and a second portion, covering the first portion to seal the gap.

In an embodiment of the present disclosure, a thickness of the second portion of the second electrode is greater than a thickness of the first portion of the second electrode.

In an embodiment of the present disclosure, the second portion of the second electrode comprises a first convex portion disposed over the gap and protruding opposite to the gap.

In an embodiment of the present disclosure, the optical sensor further includes an anti-reflective layer, disposed over the first convex portion of the second electrode.

In an embodiment of the present disclosure, the second portion of the second electrode comprises a second convex portion over the gap, adjacent to the first convex portion and protruding toward the gap.

In an embodiment of the present disclosure, a thickness of the second electrode is greater than a thickness of the first electrode.

In an embodiment of the present disclosure, the first electrode further comprises a cap portion covering the U-shaped portion, and the gap is sealed by the cap portion and the U-shaped portion of the first electrode.

In an embodiment of the present disclosure, a thickness of the cap portion is greater than a thickness of the U-shaped portion of the first electrode.

In an embodiment of the present disclosure, the cap portion of the first electrode comprises a concave portion disposed over the gap and facing the gap.

In an embodiment of the present disclosure, the cap portion of the first electrode comprises a convex portion disposed over the gap and protruding away from the gap.

In an embodiment of the present disclosure, the photodiode lines the first electrode and comprises a convex portion over the convex portion of the first electrode.

In an embodiment of the present disclosure, the second electrode lines the photodiode and comprises a convex portion corresponding to the convex portion of the photodiode.

In an embodiment of the present disclosure, the optical sensor further includes an anti-reflective layer, lining the photodiode and comprising a convex portion over the convex portion of the photodiode.

In an embodiment of the present disclosure, a thickness of the first electrode is greater than a thickness of the second electrode.

In an embodiment of the present disclosure, the first electrode or the second electrode sealing the gap comprises a top surface facing away from the gap, and the top surface has a recessed portion overlapping the gap.

In an embodiment of the present disclosure, the transistor is a thin-film transistor, and the first electrode is electrically connected to a source/drain region of the transistor.

In an embodiment of the present disclosure, the optical sensor further includes a reflective layer disposed between the dielectric layer and the first electrode.

In an embodiment of the present disclosure, the substrate comprises a flexible substrate.

From another aspect of the present disclosure, an optical sensor is provided. The optical sensor includes: a substrate, a transistor, a dielectric layer, a first electrode, a photodiode, a second electrode, an anti-reflective layer and a gap. The transistor is disposed over the substrate. The dielectric layer is disposed over the transistor. The first electrode is disposed over the dielectric layer and includes a U-shaped portion electrically connected to the transistor. The second electrode is conformally disposed over the first electrode, and the photodiode is disposed between the first electrode and the second electrode. The gap is surrounded by the U-shaped portion of the first electrode and disposed between the second electrode and at least a portion of the anti-reflective layer.

In an embodiment of the present disclosure, the gap is sealed in the anti-reflective layer.

In an embodiment of the present disclosure, the gap is defined by the second electrode and the anti-reflective layer.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
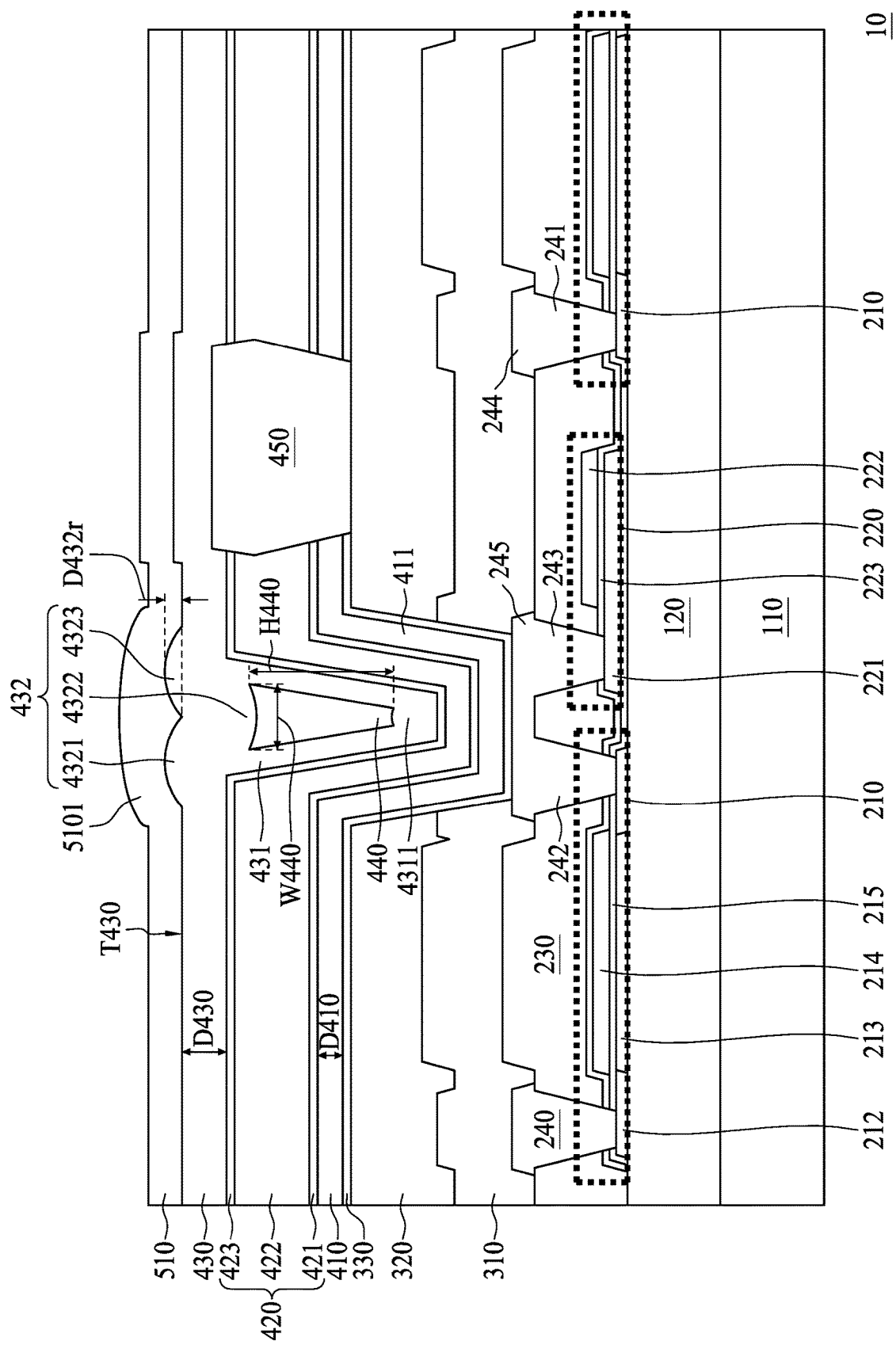
FIG. 1 is a cross-sectional diagram of an optical sensor in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±50, less than or equal to ±40, less than or equal to ±30, less than or equal to ±20, less than or equal to ±10, less than or equal to ±0.50, less than or equal to ±0.1°, or less than or equal to ±0.05°.

FIG. 1 shows a cross-sectional diagram of an optical sensor 10 in accordance with some embodiments of the present disclosure. A substrate 110 is provided in the optical sensor 10. The substrate 110 is a transparent substrate, or at least a portion of the substrate 110 is transparent. In some embodiments, the substrate 110 is an inflexible substrate, and a material of the substrate 110 may include glass, quartz, or other suitable material. In some embodiments, the substrate 110 is a flexible substrate, and a material of the substrate 110 may include transparent epoxy resin, polyimide, polyvinyl chloride, methyl methacrylate, or other suitable material. A dielectric layer 120 is optionally disposed over the substrate 110 as shown in FIG. 1. In some embodiments, the dielectric layer 120 may include silicon oxide, silicon nitride, silicon oxynitride, or other suitable materials.

A circuit or several circuits are disposed over the substrate 110. The circuit may have several transistors 210 and several capacitors 220 adjacent to the transistors, wherein the transistors 210 and the capacitors 220 are formed over the dielectric layer 120. In some embodiments, the transistors are thin-film transistors (TFT). Each transistor 210 includes source/drain regions 212 (including at least a source region and a drain region), a channel region 213 between the source/drain regions 212, a gate electrode 214 over the channel region 213, and a gate insulator 215 between the channel region 213 and the gate electrode 214. The gate electrode 214 can be made with conductive material such as metal, silicide, or metal alloy. In some embodiments, the gate electrode 214 can be a composite structure including several different layers and the different layers may be distinguishable after applying etchant and observed under microscope. In some embodiments, the gate electrode 214 is formed concurrently with a first metal layer of an inter-layer dielectric structure 230. The inter-layer dielectric structure 230 is disposed over the circuit or the transistors 210. The inter-layer dielectric structure 230 may include several layers of metal wiring and dielectric material for electrical connection and isolation. The channel region 213 of the transistor 210 may be made with semiconductive material such as silicon, or other element selected from group IV, or groups III and V.

In some embodiments, the gate insulator 215 covers the channel region 213 and the source/drain regions 212 of the transistor 210, and the gate insulator 215 is disposed between the adjacent capacitor 220 and the dielectric layer 120. In some embodiments, the gate insulator 215 is formed after formation of the source/drain regions 212 and the channel region 213 over the dielectric layer 120. The source/drain regions 212 are disposed on opposite sides of the channel region 213 to provide carriers. In some embodiments, the capacitors 220 are disposed between the transistors 210. Each capacitor 220 includes a bottom electrode 221, a top electrode 222, and an insulating layer 223 between the top electrode 222 and the bottom electrode 221. In some embodiments, the bottom electrode 221 is formed concurrently with a first metal layer of the inter-layer dielectric structure 230 over the dielectric layer 120. In some embodiments, the insulating layer 223 is formed over the transistors 210 after formation of the first metal layer. In some embodiments, the insulating layer 223 is disposed on and conformal to the bottom electrode 221 and also the transistors 210. The top electrode 222 is disposed over the insulating layer 223 in the inter-dielectric structure 230. The top electrode 222 may include titanium, aluminum, copper, titanium nitride, a combination thereof, or other suitable materials. In some embodiments, the top electrode 222 is formed concurrently with a second metal layer of the inter-layer dielectric structure 230. In some embodiments, the top electrode 222 and the second metal layer are formed after formation of the insulating layer 223.

A connecting structure 240 is formed to electrically connect the transistor 210 to the capacitor 220. The connecting structure 240 includes a plurality of connecting vias and a plurality of connecting lines. The connecting vias may connect to the source/drain regions 212 of the transistor 210, the gate electrode 214 of the transistor 210, and the bottom and/or top electrodes 221 and 222 of the capacitors 220 to the connecting line and to form an integrated circuit over the substrate 110. The connecting structure 240 may include some connecting vias 241, which connect to the drain region 212 of the transistor 210 at one end. The connecting structure 240 may include some connecting vias 242, which connect to the source region 212 of the transistor 210 at one end. The connecting structure 240 may include some connecting vias 243, which connect to the bottom electrode 221 of the capacitor 220 at one end. The connecting structure 240 may include some connecting lines 244, which connect to the connecting vias 241 at one end, respectively. The connecting structure 240 may include some connecting lines, which only connect to the connecting vias 242 at one end, respectively (not shown). The connecting structure 240 may further include some connecting lines 245, which connect to the connecting vias 242 and also the connecting vias 243 at one end. In some embodiments, the connecting lines are formed concurrently with one of the metal layers (e.g., a third metal layer) of the inter-layer dielectric structure 230.

A data line (not shown) is disposed over the connecting lines of the connecting structure 240 to electrically connect to the source/drain regions 212. A dielectric layer 310 is disposed over the data line, the inter-layer dielectric structure 230 and the connecting structure 240. In some embodiments, the dielectric layer 310 is formed by a conformal deposition. The dielectric layer 310 can be conformal to a configuration of the underlying structure. A planar layer 320 is disposed over the dielectric layer 310. In some embodiments, the planar layer 320 includes dielectric or insulating materials. In some embodiments, the planar layer 320 is formed by a blanket deposition, wherein a bottom surface of the planar layer 320 is conformal to a configuration of the underlying structure, and a top surface of the planar layer 320 is substantially planar. In some embodiments, the planar layer 320 and the dielectric layer 310 include a through hole (or an opening) over the connecting line 245, wherein the connecting line 245 is exposed through the dielectric layer 310 and the planar layer 320 via the through hole.

In the optical sensor 10, a first electrode 410 is disposed over the planar layer 320, wherein a portion of the first electrode 410 has a planar surface as the planar layer 432, and a portion of the first electrode 410 penetrates through the planar layer 320 and the dielectric layer 310 to electrically connect to the connecting line 245. The first electrode 410 includes a U-shaped portion 411 disposed in the through hole from a cross-sectional perspective, and the U-shaped portion 411 of the first electrode 410 is surrounded by the planar layer 320 and the dielectric layer 310. The first electrode 410 electrically connects to the transistor 210 and/or the capacitor 220 through the U-shaped portion 411 and the connecting structure 240 (including the connecting vias 242, 243 and the connecting line 245). In some embodiments, the U-shaped portion 411 of the first electrode 410 electrically connects to the transistor 210 through a conductive material or an electrical component. In some embodiments, a bottom of the U-shaped portion 411 of the first electrode 410 physically contacts the connecting line 245. In some embodiments, the bottom of the U-shaped portion 411 of the first electrode 410 completely overlaps the connecting line 245.

In some embodiments, the optical sensor 10 further includes a reflective layer 330 disposed between the planar layer 320 and the first electrode 410, and between the connecting line 245 and the first electrode 410. The reflective layer 330 is conformal to the through hole and the planar layer 320. The reflective layer 330 includes a U-shaped configuration conformal to the U-shaped portion 411 of the first electrode 410. The reflective layer 330 may be made of one or more metal materials. In some embodiments, the reflective layer 330 includes aluminum. In some embodiments, the reflective layer 330 physically contacts the connecting line 245, and the first electrode 410 electrically connects to the transistor 210 and/or the capacitor 220 through the reflective layer 330.

In the optical sensor 10, a photodiode 420 is disposed over and conformal to the first electrode 410, wherein a portion of the photodiode 420 is disposed over the planar layer 320 and thus has a planar surface as the planar layer 320, and a portion of the photodiode 420 is also in a U-shaped configuration corresponding to the U-shaped portion of the first electrode 410 from a cross-sectional perspective. The photodiode 420 can be a PIN photo-sensor including an N-type doping layer 421, an intrinsic layer 422, and a P-type doping layer 423 stacked in sequence over the first electrode 410. In some embodiments, the N-type doping layer 421, the intrinsic layer 422, and the P-type doping layer 423 are α-silicon layers. In some embodiments, a portion, having the U-shaped configuration, of the photodiode 420 is between (or surrounded by) the planar layer 320. In some embodiments, the portion having the U-shaped configuration of the photodiode 420 penetrates through the planar layer 320. In some embodiments, a bottom of the photodiode 420 is between (or surrounded by) the dielectric layer 310.

In the optical sensor 10, a second electrode 430 is disposed over the photodiode 420, and a gap 440 is sealed by the second electrode 430. The photodiode 420 is disposed between the first electrode 410 and the second electrode 430. A portion of the second electrode 430 is disposed over the planar layer 320 and thus has a planar surface as the planar layer 320. Further, the second electrode 430 includes a first portion 431 and a second portion 432. The first portion 431 lines the photodiode 420 corresponding to the U-shaped portion 411 of the first electrode 410. The first portion 431 of the second electrode 430 also has a U-shaped configuration corresponding to the U-shaped configuration of the photodiode 420 and the U-shaped portion 411 of the first electrode 410. In some embodiments, the first portion 431 includes a convex portion 4311 at the bottom of the U-shaped configuration. The convex portion 4311 is adjacent to the gap 440 and protrudes toward the gap 440. The second portion 432 is disposed over the first portion 431 to form the gap 440 in the second electrode 430 at a position corresponding to the U-shaped portion 411 of the first electrode 410. The gap 440 is surrounded, in sequence toward the gap 440, by the U-shaped portion 411 of the first electrode, the portion having the U-shaped configuration of the photodiode 420, and the first portion 431 of the second electrode 430 from a cross-sectional perspective. In some embodiments, in order to seal the gap 440 inside the second electrode 430, a thickness D430 of the second electrode 430 is greater than a thickness D410 of the first electrode 410. In addition, due to formation of the second electrode 430 (details of forming the gap 440 within the second electrode 430 are illustrated in the following description), in some embodiments, the second portion 432 of the second electrode 430 includes convex portions 4321 and 4323 over the gap 440 and protruding away from the gap 440 from a cross-sectional perspective as shown in FIG. 1. In some embodiments, the second portion 432 includes only one convex portion (not shown) over the gap 440 and protruding away from the gap 440. In some embodiments, the second electrode 430 has a top surface T430 with a recessed portion between the convex portions 4321 and 4323 from the cross-sectional perspective. The recessed portion of the top surface T430 of the second electrode 430 overlaps the gap 440. In some embodiments, the recessed portion of the top surface T430 is directly over the gap 440. In some embodiments, the second portion 432 of the second electrode 430 further includes a convex portion 4322 over the gap 440 and protruding toward the gap 440. In some embodiments having the gap 440 sealed in the second electrode 430, the second electrode 430 is a multi-layer structure. In some embodiments, average grain sizes of the first portion 431 and the second portion 432 are different. In some embodiments, an interface or a boundary between the first portion 431 and the second portion 432 of the second electrode 430 can be observed under microscope.

Figure 2:
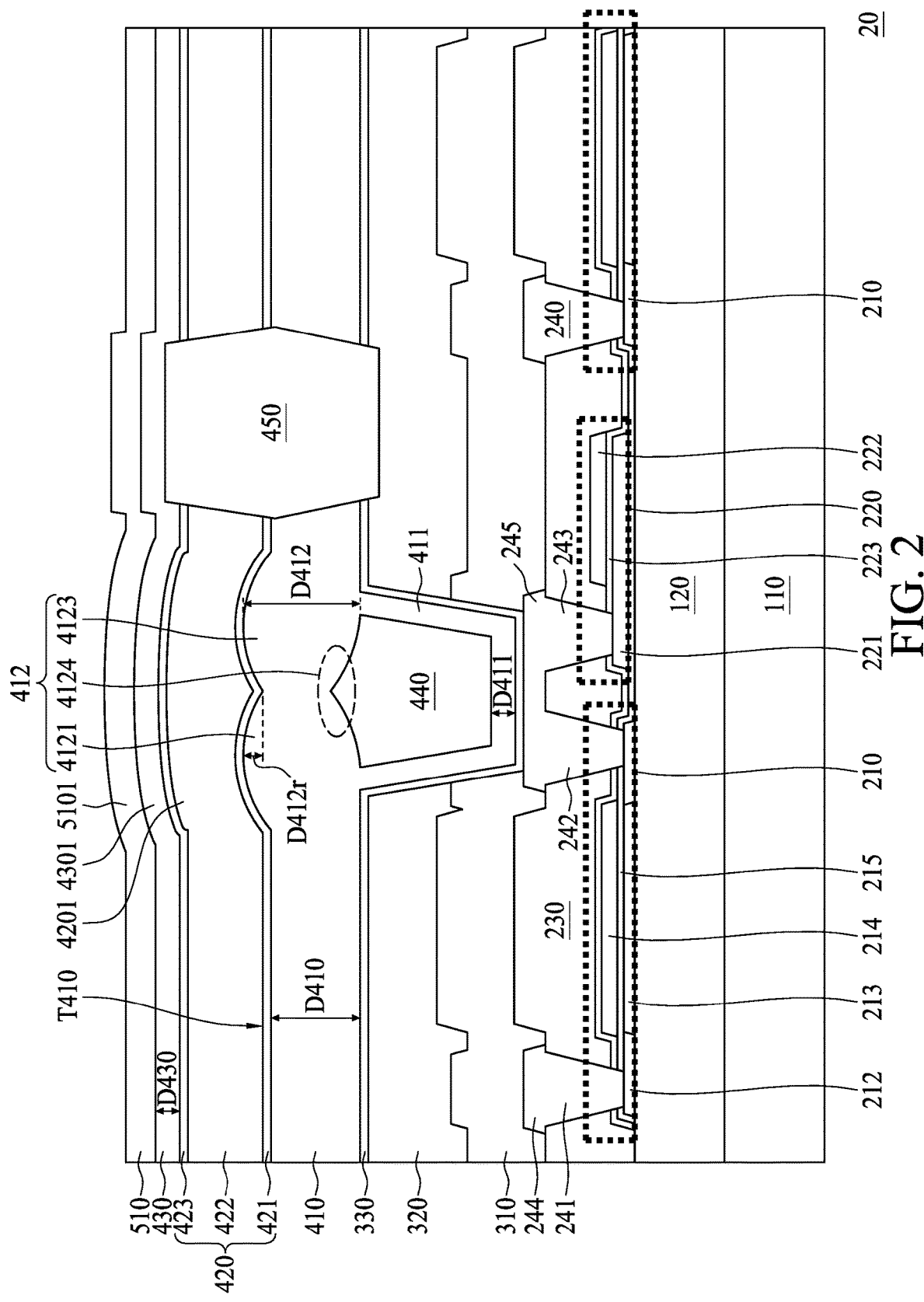
FIG. 2 is a cross-sectional diagram of an optical sensor in accordance with some embodiments of the present disclosure.

A pixel defining layer (PDL) 450 is disposed at the same elevation as the photodiode 420 and separated from the gap 440 and adjacent to the U-shaped portion 411 of the first electrode 410. In some embodiments, the PDL 450 is configured to separate luminous regions of different pixel units of the optical sensor 10. In some embodiments, the PDL 450 encircles the gap 440, the photodiode 420, the transistor 210 and the capacitor 220 from a top view perspective (not shown; the cross-sectional diagrams of FIGS. 1 and 2 show only a portion of the PDL 450). In some embodiments, the PDL 450 is covered by the second electrode 430.

An anti-reflective layer 510 is disposed over the second electrode 430. The anti-reflective layer 510 includes a convex portion 5101 at a position corresponding to the convex portions 4321 and 4323 of the second electrode 430. Further, the convex portion 5101 is formed over the gap. In some embodiments, due to a small value of a depth D432r of the recessed portion of the top surface T430 of the second electrode 430, the anti-reflective layer 510 includes only one convex portion 5101 covering the convex portions 4321 and 4323 as shown in FIG. 1. In some embodiments, the anti-reflective layer 510 may include two convex portions 5101 (not shown) corresponding to the convex portions 4321 and 4323 of the second electrode 430. The anti-reflective layer 510 of the present disclosure is made of transparent materials. In some embodiments, the anti-reflective layer 510 includes silicon oxynitride.

The U-shaped configuration of the photodiode 420 can increase an area of light absorption and thus enhance signal detection of the optical sensor 10. Signals can be enhanced especially under a low light environment, e.g., when using a finger or a stylus to control a touch panel. Incident light may enter the optical sensor 10 from outside the anti-reflective layer 510. The convex portion 5101 of the anti-reflective layer 510 can function as a micron lens to change direction of incident light toward the photodiode 420 in the gap 440. Therefore, the incident light from different directions is concentrated and redirected toward the gap 440. In some embodiments, a height H440 of the gap 440 is in a range of 10 to 5000 nm. In some embodiments, for a better concentration result, an aspect ratio (the height H440 to a top width W440) of the gap 440 is in a range of 2 to 30.

Figure 17:
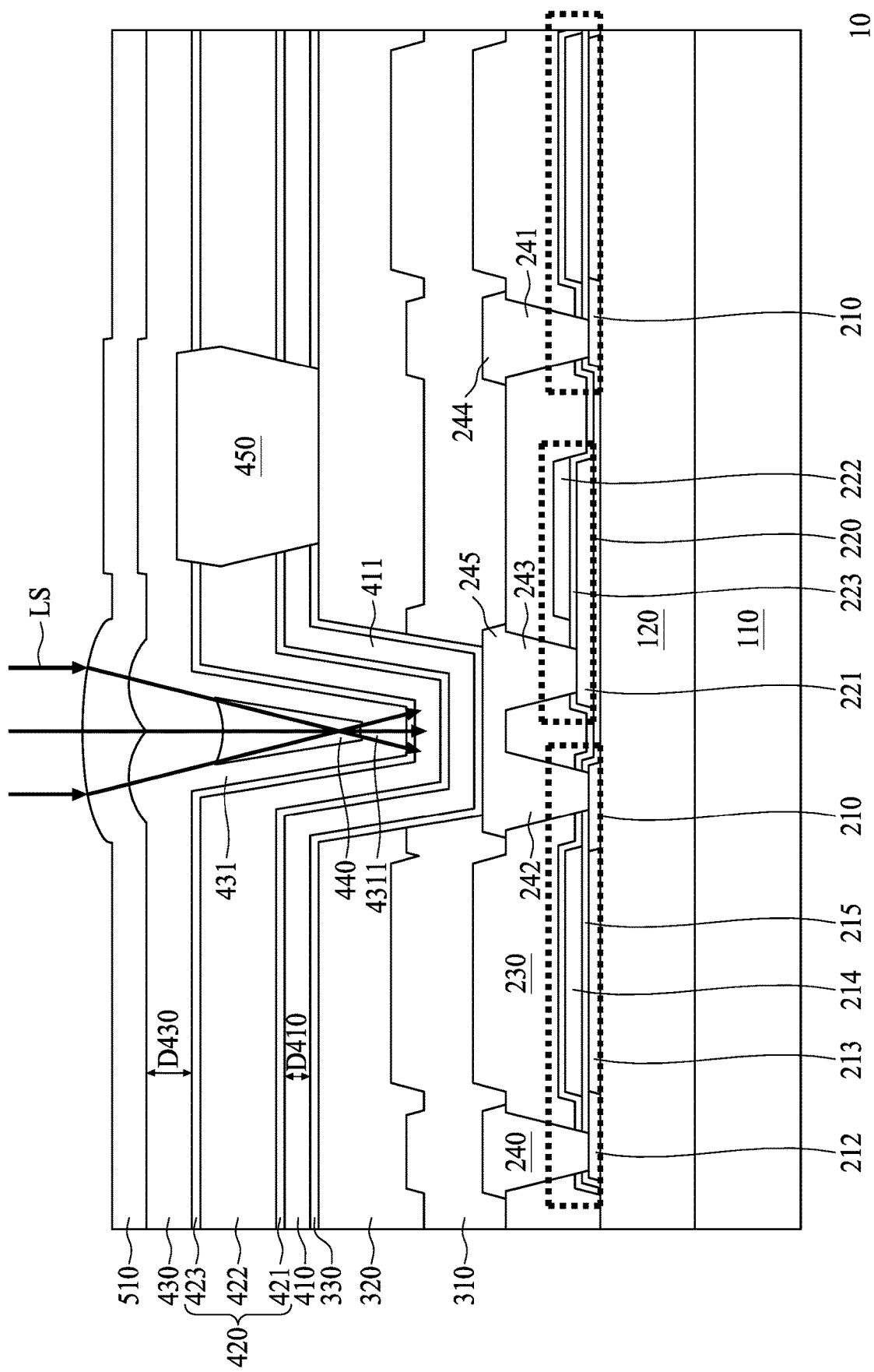
FIG. 17 is a cross-sectional diagram illustrating optical paths of incident lights into an optical sensor in accordance with some embodiments.

In some embodiments, incident lights LS is concentrated and focused in the gap 440 as shown in FIG. 17. In some embodiments, the focus of the concentrated incident light LS is in the gap 440 and proximal to the convex portion 4311 of the second electrode 430. In some embodiments, the focus of the concentrated incident light LS is at a surface of the convex portion 4311 of the second electrode 430. By concentrating the incident lights LS, signals strength can be increased. In some embodiments, the anti-reflective layer 510 functions to increase light absorption, and a layer of a micron lens array is not formed over the anti-reflective layer 510. In some embodiments, the layer of the micron lens array is formed over the anti-reflective layer 510 to further increase light absorption. The anti-reflective layer 510 can be similar to a conventional anti-reflection coating layer used in semiconductor manufacturing.

The incident light passing through the gap 440 is concentrated due to different reflective indexes of the second electrode 430 and the gap 440. In some embodiments, the gap 440 is formed in a low-pressure environment. In some embodiments, the gap 440 is a substantially vacuum environment. A reflective index of the second electrode 430 is greater than a reflective index of the gap 440, and the incident light is concentrated when entering the gap 440 from the second electrode 430. The use of the reflective layer 330 has an advantage of reflecting incident light back into the photodiode 420. Light signals can be enhanced by the presence of the gap 440 of the present disclosure, and further enhanced by the presence of the reflective layer 330. Moreover, formation of the gap 440 can be integrated with formation of electrical connection between a photodiode and a transistor in a conventional manufacturing process. Formation of the optical sensor 10 can be highly integrated with a manufacturing process of a conventional optical sensor.

In order to further illustrate concepts of the present disclosure, various embodiments are provided below. However, it is not intended to limit the present disclosure to specific embodiments. In addition, conditions or parameters illustrated in different embodiments can be combined or modified to form different combinations of embodiments as long as the parameters or conditions used are not conflicted. For ease of illustration, reference numerals with similar or same functions and properties are repeatedly used in different embodiments and figures, but such repetition is not intended to limit the present disclosure to specific embodiments.

FIG. 2 shows a cross-sectional diagram of an optical sensor 20 in accordance with some embodiments of the present disclosure. The optical sensor 20 is similar to the optical sensor 10. In the following description, only features of the optical sensor 20 that are different from those of the optical sensor 10 are mentioned for the purpose of brevity, but are not intended to limit the present disclosure.

In the optical sensor 20, a gap 440 is disposed within a first electrode 410. The gap 440 of the optical sensor 20 is surrounded by a U-shaped portion 411 of the first electrode 410. The first electrode 410 of the optical sensor 20 further includes a cap portion 412 covering the U-shaped portion 411, wherein the gap 440 is sealed by the cap portion 412 and the U-shaped portion 411 of the first electrode 410. A thickness D412 of the cap portion 412 is greater than a thickness D411 of the U-shaped portion 411. The cap portion 412 of the first electrode 410 of the optical sensor 20 is similar to the second portion 432 of the second electrode 430 of the optical sensor 10. Due to formation of the first electrode 410 (details of forming the gap 440 within the first electrode 410 are illustrated in the following description), in some embodiments, the cap portion 412 of the first electrode 410 includes convex portions 4121 and 4123 over the gap 440 and protruding away from the gap 440. In some embodiments, the cap portion 412 of the first electrode 410 includes only one convex portion (not shown) over the gap 440 and protruding away from the gap 440. In some embodiments, the first electrode 410 has a top surface T410 with a recessed portion between the convex portions 4121 and 4123 from a cross-sectional perspective. The recessed portion of the top surface T410 of the first electrode 410 overlaps the gap 440. In some embodiments, the recessed portion of the top surface T410 is directly over the gap 440. In some embodiments, the cap portion 412 of the first electrode 410 further includes a concave portion 4124 over the gap 440 and facing the gap 440. In some embodiments having the gap 440 sealed in the first electrode 410, the first electrode 410 is a multi-layer structure. In some embodiments, average grain sizes of the U-shaped portion 411 and the cap portion 412 are different. In some embodiments, an interface or a boundary between the U-shaped portion 411 and the cap portion 412 of the second electrode 430 can be observed under microscope.

A photodiode 420, which includes an N-type doping layer 421, an intrinsic layer 422, and a P-type doping layer 423 stacked in sequence, is disposed over the first electrode 410. The photodiode 420 includes one or more convex portions 4201 at a position corresponding to the convex portions 4121 and 4123. In some embodiments, due to a small value of a depth D412r of the recessed portion of the top surface T410 of the first electrode 410, the photodiode 420 includes only one convex portion 4201 covering the convex portions 4121 and 4123 as shown in FIG. 2. A second electrode 430 is disposed over the photodiode 420. The second electrode 430 includes a convex portion 4301 over the convex portion 4201 of the photodiode 420. A configuration of the convex portion 4301 of the second electrode 430 corresponds to a configuration of the convex portion 4201 of the photodiode 420. An anti-reflective layer 510 is disposed over the second electrode 430. The anti-reflective layer 510 includes a convex portion 5101 at a position corresponding to the convex portion 4301 of the second electrode 430. A configuration of the convex portion 5101 of the anti-reflective layer 510 is in accordance with the configuration of the convex portion 4301 of the second electrode 430. In some embodiments having the gap in the first electrode 410, a thickness D430 of the second electrode 510 is less than the thickness D410 of the first electrode 410. In some embodiments, the thickness D430 of the second electrode 510 is in a range of 10 to 100 nanometers. In some embodiments, the thickness D410 of the first electrode 410 is in a range of 300 to 750 nanometers.

The convex portion 5101 of the anti-reflective layer 510 can function as a micron lens to change direction of incident light toward the photodiode 420. A layer of a micron lens array disposed over the anti-reflective layer 510 of the optical sensor 20 is optional. Incident light passing through the gap 440 is concentrated due to different reflective indexes of the first electrode 410 and the gap 440. Light signals can be further enhanced by the presence of the gap 440 of the present disclosure. In addition, formation of the gap 440 in the first electrode 410 can be integrated with formation of electrical connection between a photodiode and a transistor in a conventional manufacturing process. Formation of the optical sensor 20 can be highly integrated with a manufacturing process of a conventional optical sensor.

Figure 3:
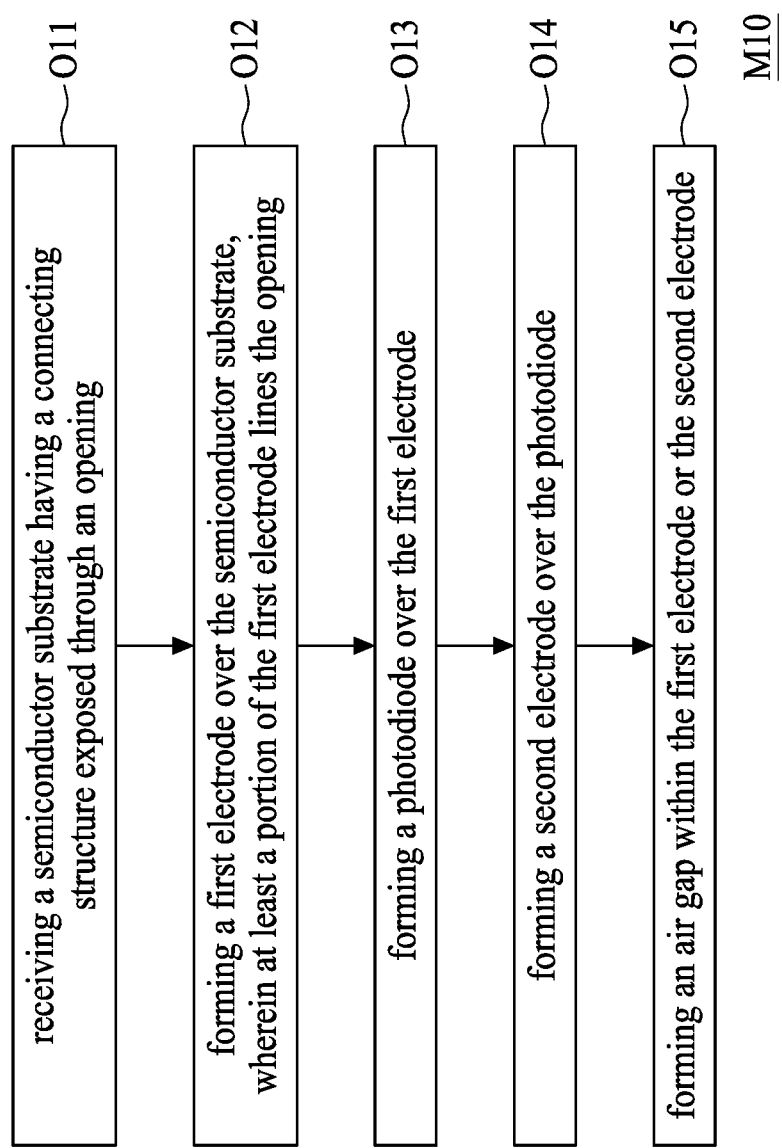
FIG. 3 is a flowchart showing various steps of a method for forming an optical sensor in accordance with some embodiments of the present disclosure.

In order to further illustrate the present disclosure, FIG. 3 is a flowchart of a method M10 for forming an optical sensor in accordance with some embodiments. The method M10 for forming an optical sensor similar to the optical sensor 10 or 20 includes following operations: (O11) receiving a semiconductor substrate having a connecting structure exposed through an opening; (O12) forming a first electrode over the semiconductor substrate, wherein at least a portion of the first electrode lines the opening; (O13) forming a photodiode over the first electrode; (O14) forming a second electrode over the photodiode; and (O15) forming an gap within the first electrode or the second electrode. It should be noted that the flowchart shown in FIG. 3 is for a purpose of illustration but is not intended to limit the operations into a specific order. A sequence of the operations (O11) to (O15) can be arranged in accordance with different embodiments.

Figure 4:
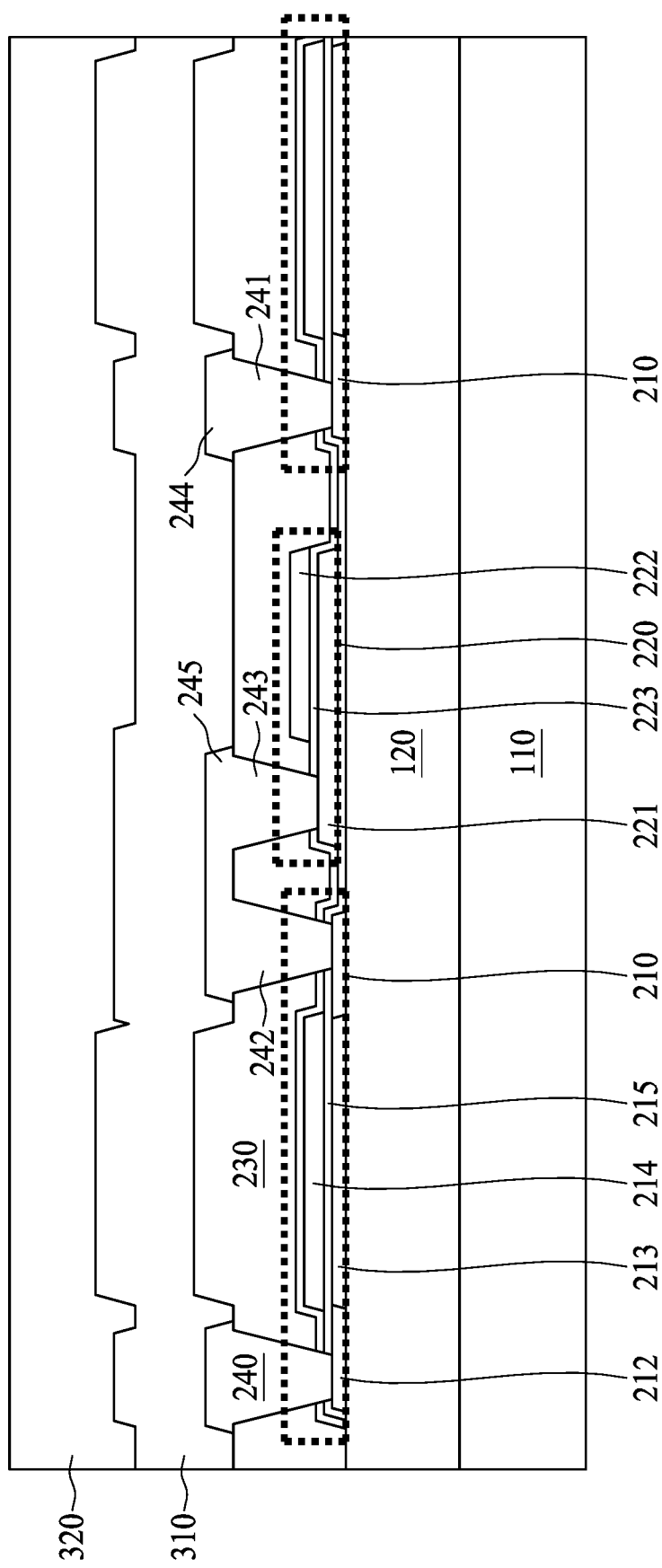
FIGS. 4 to 10 are schematic views of an optical sensor at various stages of manufacture by a method in accordance with some embodiments of the present disclosure.
Figure 5:
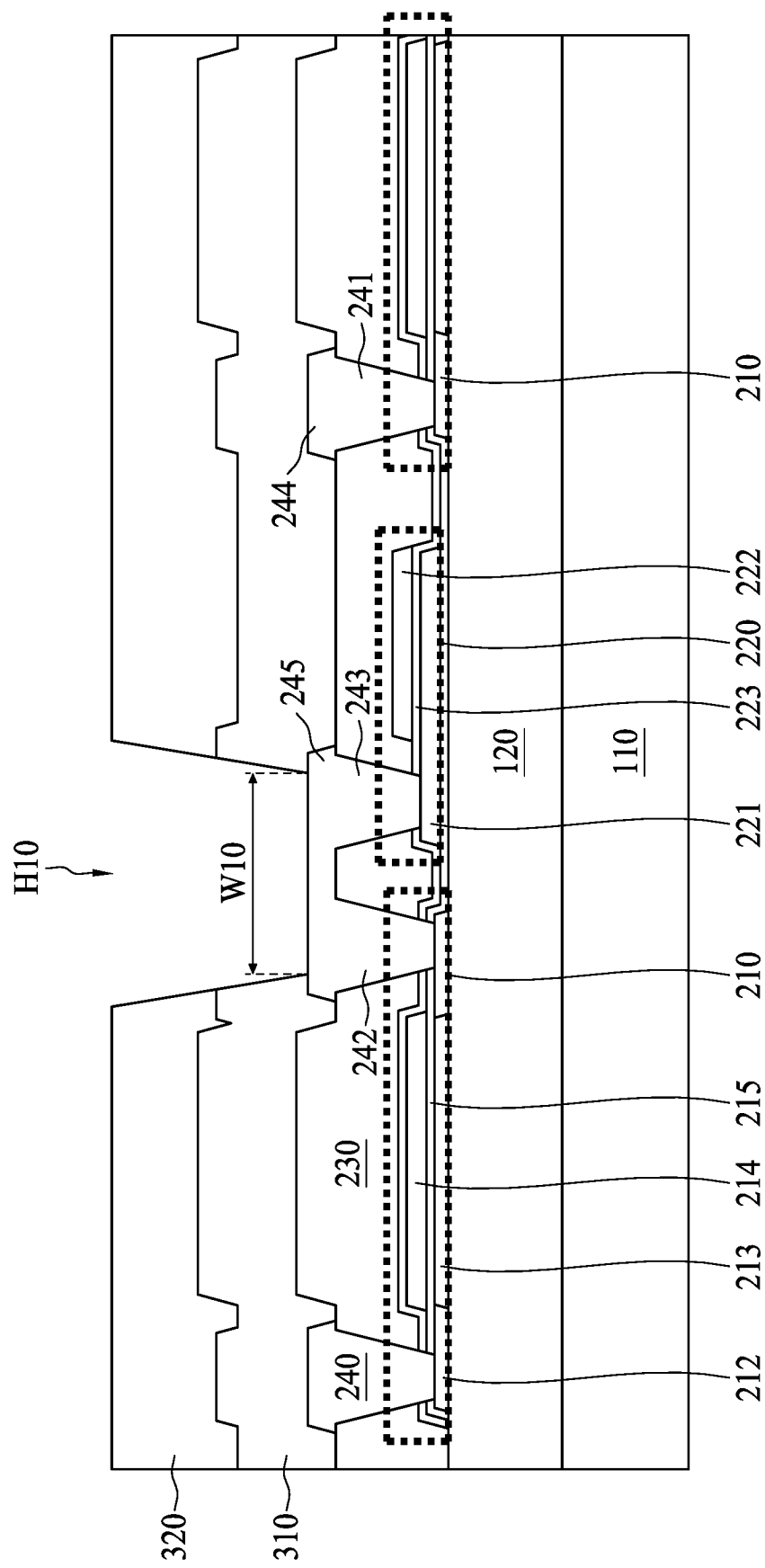

Referring to FIGS. 4 to 5 in accordance with the operation (O11), a semiconductor substrate is received. The semiconductor substrate includes a substrate 110, a dielectric layer 120, several transistors 210, several capacitors 220, an inter-layer dielectric structure 230, several connecting structures 240, a dielectric layer 310 and a planar layer 320, which are similar to those illustrated in relation to the optical sensor 10, and repeated description is omitted herein. A portion of the dielectric layer 310 and a portion of the planar layer 320 directly over a connecting line 245 of the connecting structure 240 are removed to form an opening H10 to expose the connecting line 245. In some embodiments, a diameter W10 of the opening H10 (measured at the bottom of the opening H10 on the connecting line 245) is in a range of 1.8 to 2.2 micrometers. In some embodiments, the opening H10 has a tapered configuration with a narrower bottom and a wider top.

Figure 6:
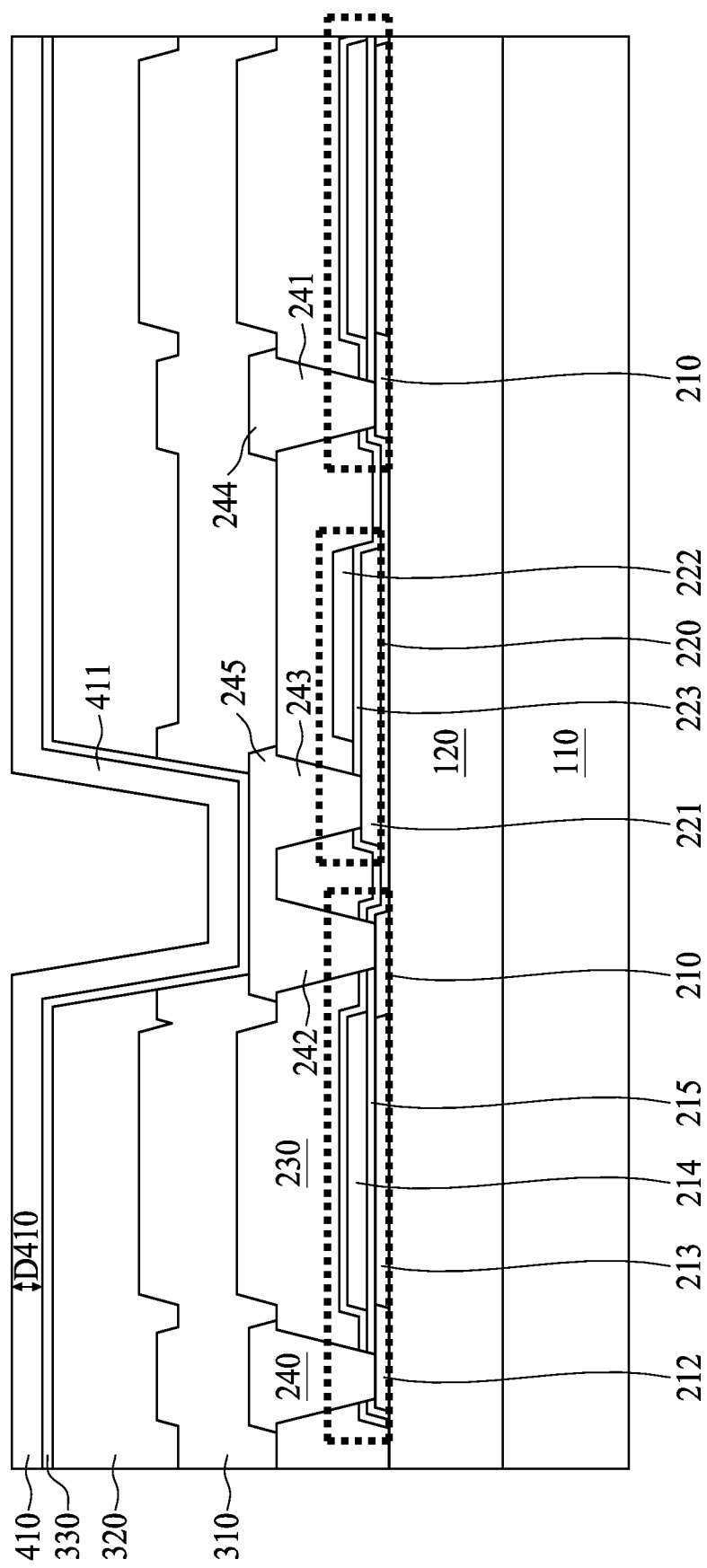

Referring to FIG. 6, in accordance with the operation (O12), a first electrode 410 is formed over the semiconductor substrate and conformal to the opening H10. A U-shaped portion 411 of the first electrode 410 lines the opening H10. In some embodiments, a reflective layer 330 is formed prior to formation of the first electrode 410. At least a portion of the reflective layer 330 lines the opening H10. In some embodiments, the reflective layer 330 and the first electrode 410 are formed by conformal depositions. In some embodiments, a reflectance of the reflective layer 330 is greater than a reflectance of the first electrode 410, and thus incident light passing through the first electrode 410 can be reflected back toward a photodiode 420 to be formed over the first electrode 410. Light absorption by the photodiode 420 can be enhanced. In some embodiments, a thickness of the reflective layer 330 is in a range of 30 to 200 nanometers. In some embodiments, the first electrode 410 includes indium tin oxide (ITO). In some embodiments, a thickness D410 of the first electrode 410 is in a range of 10 to 100 nanometers. In some embodiments, the thickness of the reflective layer 330 is greater than the thickness D410 of the first electrode 410.

Figure 7:
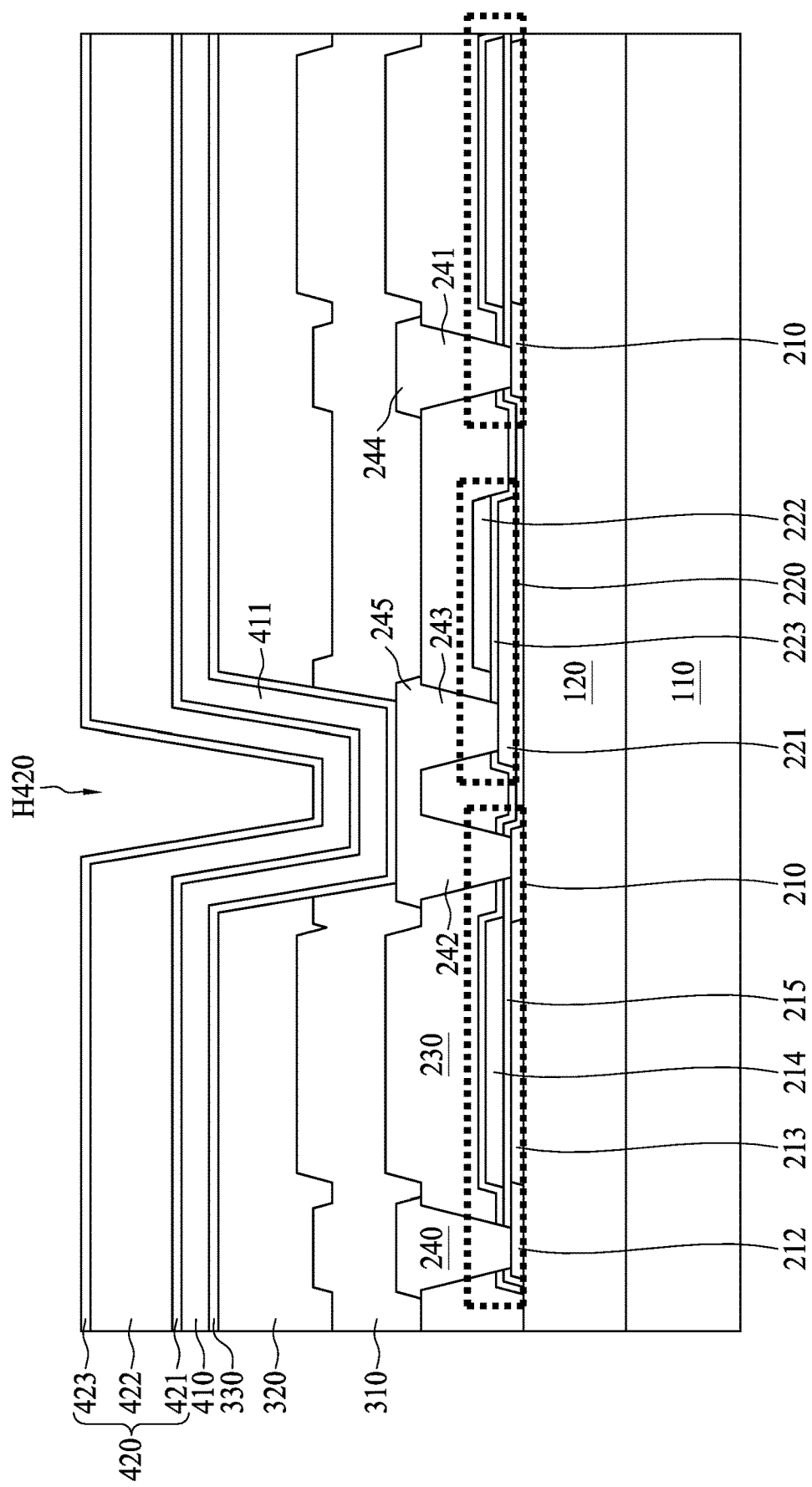

Referring to FIG. 7, in accordance with the operation (O13), the photodiode 420, which includes an N-type doping layer 421, an intrinsic layer 422, and a P-type doping layer 423 stacked in sequence, is formed over and conformal to the first electrode 410. In order to form an optical sensor similar to the optical sensor 10, the photodiode 420 is formed directly over the intermediate structure as shown in FIG. 6. A portion of the photodiode 420 has a U-shaped configuration lining the opening H10 over the U-shaped portion 411 of the first electrode 410, thereby forming an opening H420 defined by the portion of the photodiode 420 having the U-shaped configuration. The U-shaped configuration of the portion of the photodiode 420 corresponds to the U-shaped portion 411 of the first electrode 410. In some embodiments, a thickness of the N-type doping layer 421 is in a range of 10 to 50 nanometers. In some embodiments, a thickness of the intrinsic layer 422 is in a range of 300 to 500 nanometers. In some embodiments, a thickness of the P-type doping layer 423 is in a range of 5 to 20 nanometers. In some embodiments, the thickness of the N-type doping layer 421 is greater than the thickness of the P-type doping layer 423. The thicknesses of different layers of the photodiode 420 can be adjusted in order to receive light with different wavelength ranges in accordance with different embodiments.

Figure 8:
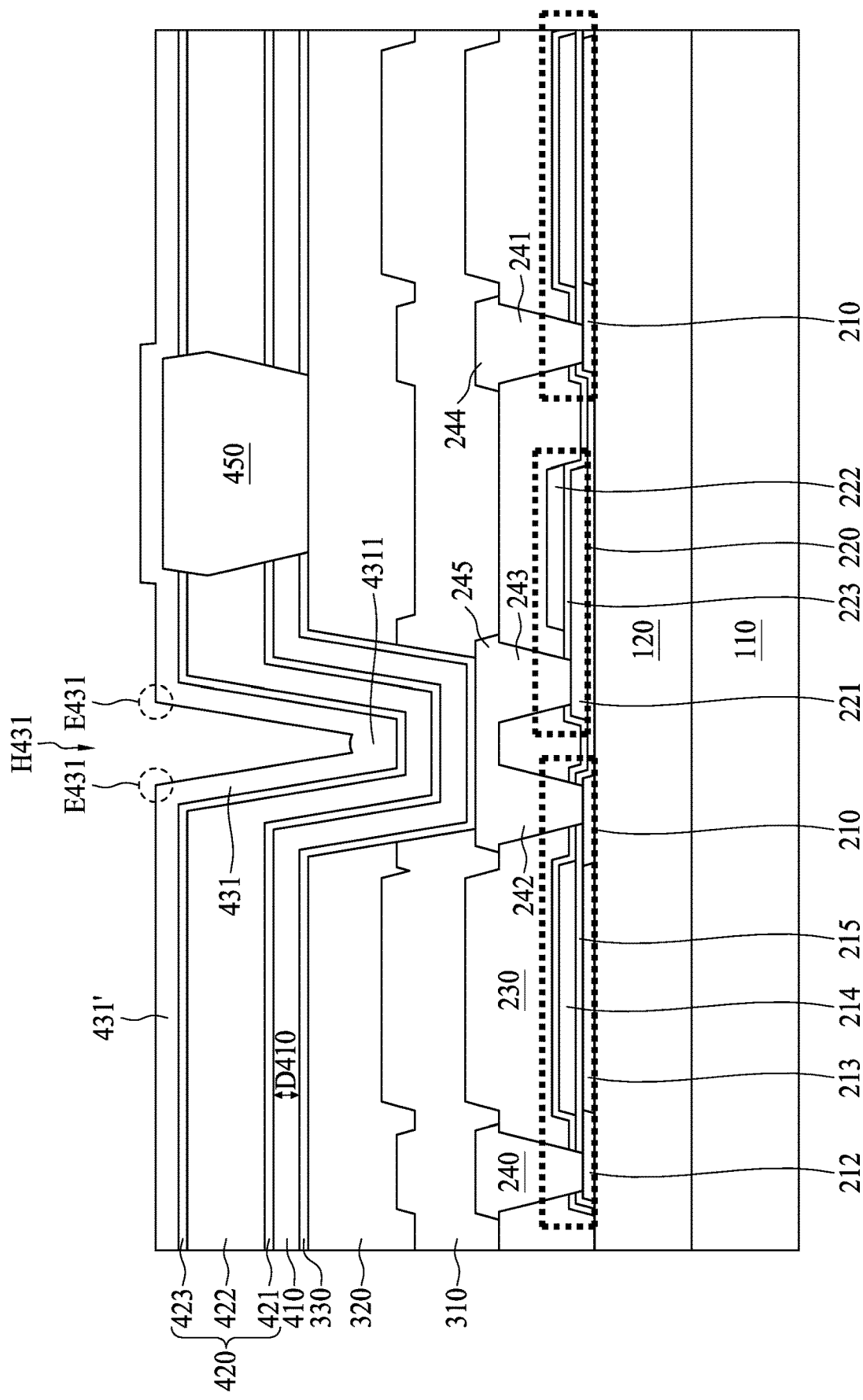
Figure 9:
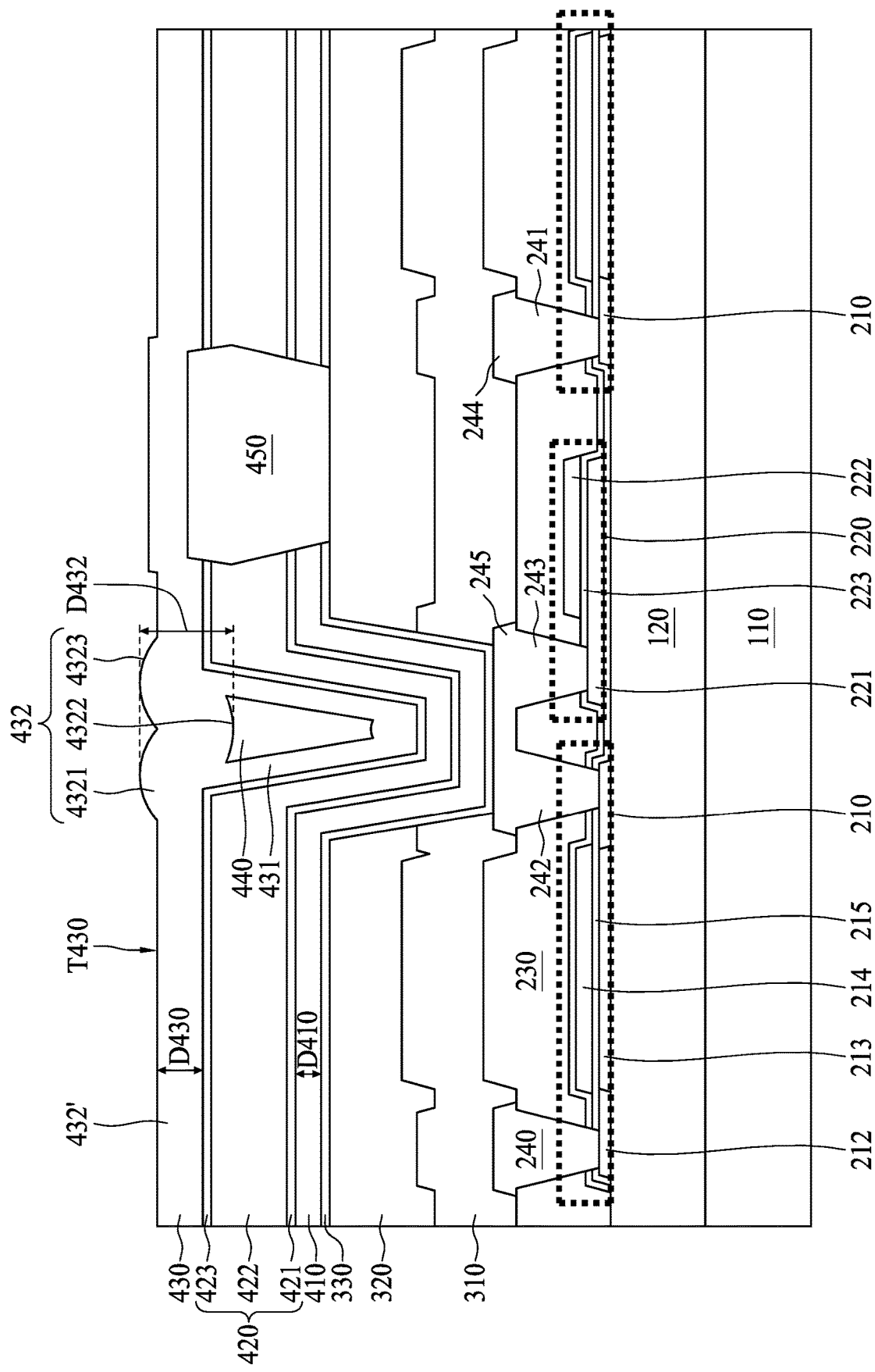

Referring to FIGS. 8 to 9, in accordance with the operations (O14) to (O15), a second electrode 430 and a gap 440 are formed by multiple depositions. A first deposition is performed as shown in FIG. 8 to form a first layer 431' including a first portion 431 of the first electrode 430 lines the photodiode 420 and disposed in the opening H420 of the photodiode 420, thereby forming an opening H431 defined by the first portion 431 of the first layer 431'. A configuration of the first portion 431 of the first layer 431' corresponds to the U-shaped configuration of the photodiode 420 and the U-shaped portion 411 of the first electrode 410. A convex portion 4311 of the first portion 431 is formed at a bottom of the first portion 431 due to limited space for deposition at the bottom of the opening H420, and due to properties of the deposition technique by which more material of the first layer 431' may be deposited at the bottom of the opening H420.

A second deposition is performed as shown in FIG. 9 to form a second layer 432' including a second portion 432 of the second electrode 430 over the first layer 431', wherein a deposition rate of the second deposition is greater than a deposition rate of the first deposition. Due to the higher deposition rate of the second deposition, the second portion 432 is not able to line the opening H431 but instead forms a cap over the opening H431. Thus, the gap 440 is formed in and sealed by the second electrode 430. Convex portions 4321 and 4323 are formed over the gap 440 corresponding to top edges E431 of the opening H431 due to properties of deposition technique. A recessed portion of a top surface T430 of the second electrode 430 is thereby formed between the convex portions 4321 and 4323. A convex portion 4322 is also formed over the gap 440 protruding toward the gap 440 during the second deposition. The deposition rate of the second deposition is adjusted according to a size of the opening H431, and is not limited herein. A thickness D430 of the second electrode 430 is greater than the thickness of the D410 of the first electrode 410 due to extra deposition.

In some embodiments, the thickness D430 of the second electrode 430 is in a range of 200 to 400 nanometers. In some embodiments, a thickness D432 of the second portion 432 covering the gap 440 is in a range of 300 to 400 nanometers. The first layer 431' and the second layer 432' together form the second electrode 430. In some embodiments, the second electrode 430 includes indium tin oxide (ITO). In some embodiments having the gap 440 sealed in the second electrode 430, the second electrode 430 is a multi-layer structure. In some embodiments, average grand sizes of the first layer 431' and the second layer 432' are different due to different deposition rate. In some embodiments, the average grain size of the first layer 431' is smaller than the average grand size of the second layer 432' of the second electrode 430 due to the lower deposition rate. In some embodiments, an interface or a boundary between the first layer 431' and the second layer 432' of the second electrode 430 can be observed under microscope.

In some embodiments, a PDL 450 is formed prior to formation of the second electrode 430. In some embodiments, the PDL 450 is formed during the forming of the photodiode 420.

Figure 10:
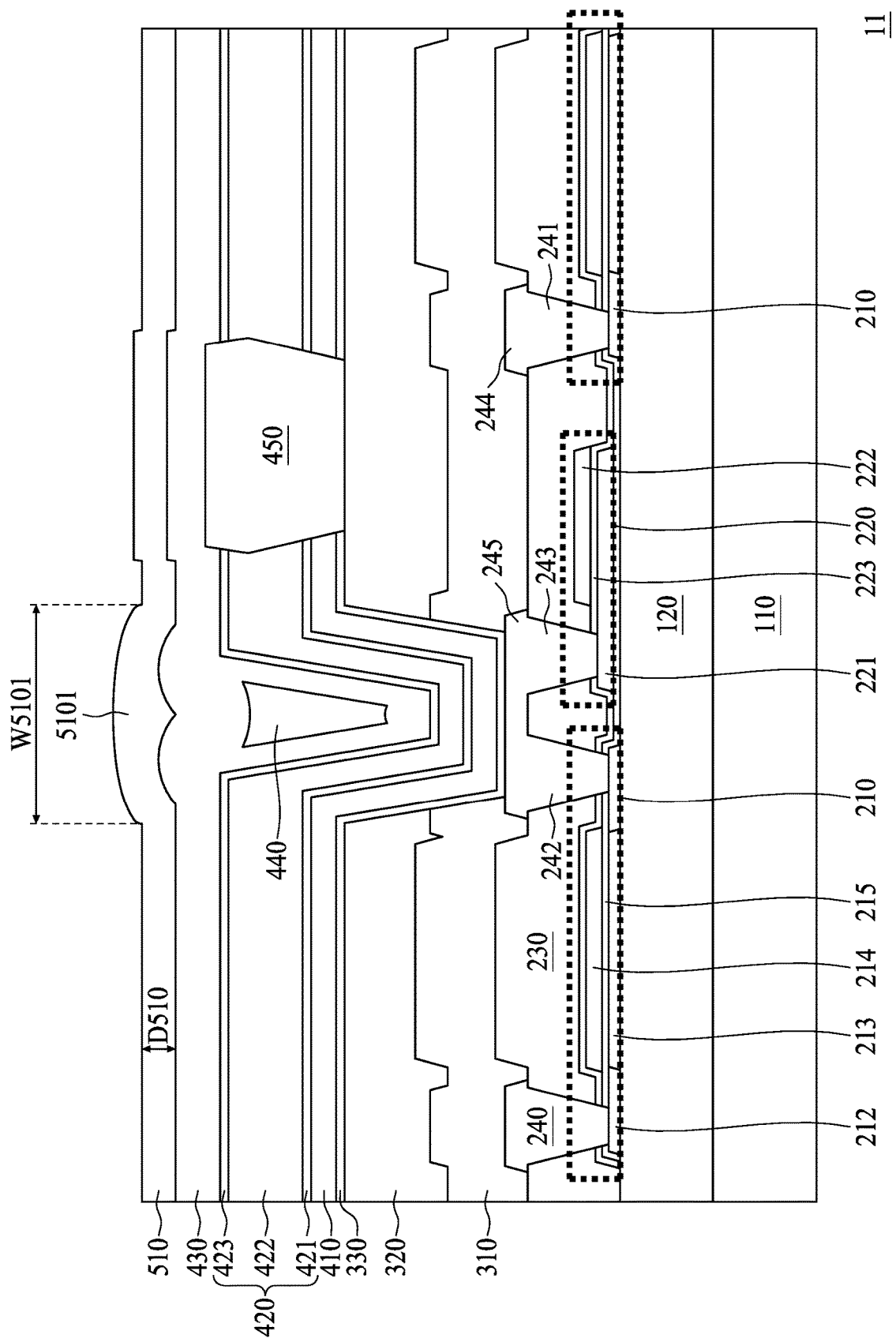

Referring to FIG. 10, an anti-reflective layer 510 is formed over the second electrode 430, and an optical sensor 11 similar to the optical sensor 10 is formed. The anti-reflective layer 510 includes a convex portion 5101 at a position corresponding to the convex portions 4321 and 4323 of the second electrode 430. The convex portion 5101 can function as a micron lens. In some embodiments, a thickness D510 of the anti-reflective layer 510 is in a range of 150 to 270 nanometers. In some embodiments, a width W5101 of the convex portion 5101 over the gap 440 is in a range of 160 to 300 micrometers. In some embodiments, the convex portion 5101 has a circular shape from a top view perspective (not shown), wherein the width W5101 is the diameter of the convex portion 5101. In some embodiments, the anti-reflective layer 510 includes two convex portions 5101 conformal to the two convex portions 4321 and 4323 of the second electrode 430 depending on a deposition rate for forming the anti-reflective layer 510. In some embodiments, a layer of a micron lens array is formed over the anti-reflective layer 510 (not shown).

Figure 11:
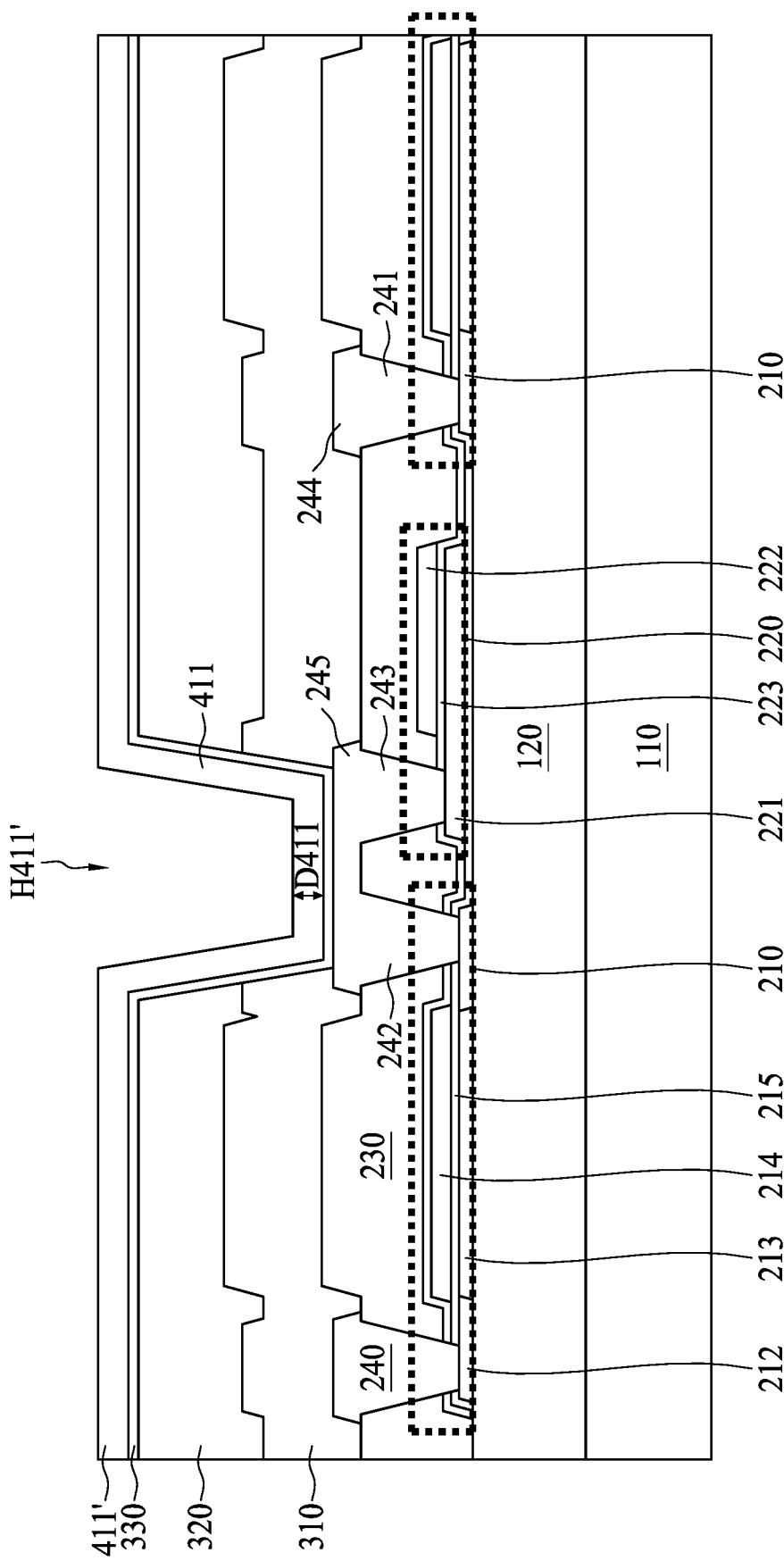
FIGS. 11 to 13 are schematic views of an optical sensor at various stages of manufacture by a method in accordance with some embodiments of the present disclosure.
Figure 12:
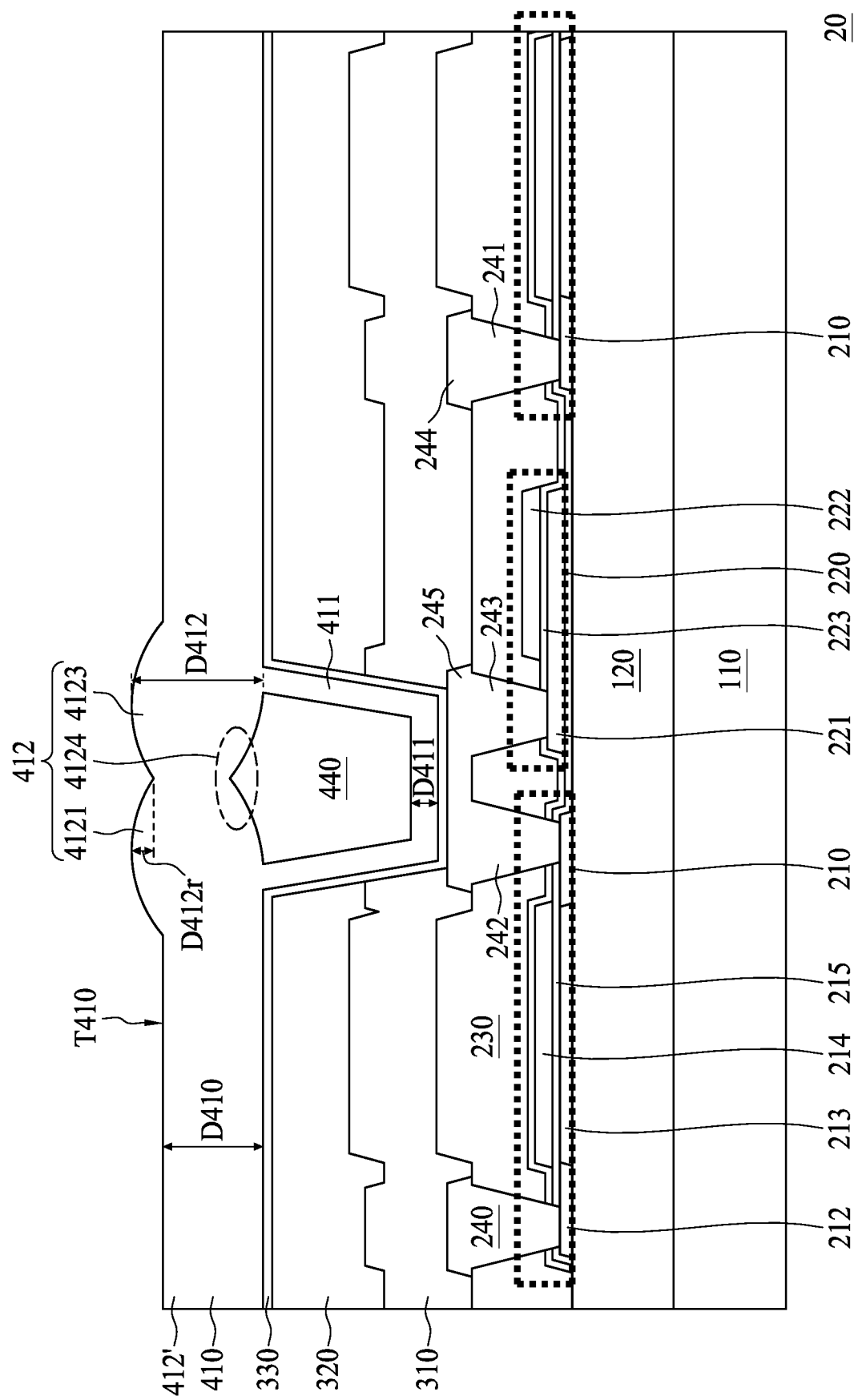

In accordance with other embodiments of the present disclosure, in order to form an optical sensor similar to the optical sensor 20, the operation (O15) is performed during formation of the first electrode 410 of the operation (O12). Referring to FIGS. 11 to 12 in accordance with some embodiments and the operations (O12) and (O15), a first deposition is performed to form a first layer 411' including a U-shaped portion 411 of the first electrode 410. The intermediate structure as shown in FIG. 11 is similar to the intermediate structure as shown in FIG. 6, and repeated description is omitted herein. In the embodiments shown in FIG. 11, a thickness of a reflective layer 330 is in a range of 30 to 200 nanometers.

A second deposition is performed to form a second layer 412' over the first layer 411', thereby forming the first electrode 410 and an gap 440 within the first electrode 410, wherein a deposition rate of the second deposition is greater than a deposition rate of the first deposition. The second layer 412' includes a cap portion 412 formed over the gap 440 and the U-shaped portion 411. The formation of the first electrode 410 as shown in FIGS. 11 to 12 is similar to the formation of the second electrode 430 as shown in FIGS. 8 to 9. However, in the embodiments shown in FIGS. 11 to 12, the cap portion 412 of the second layer 412' includes a concave portion 4124 over the gap 440 and facing the gap 440. Since the opening H411' shown in FIG. 11 is wider than the opening H431 shown in FIG. 8, the recessed portion 4124 is formed instead of a convex portion, and the recessed portion 4124 may be similar to the convex portion 4322 of the optical sensor 10.

In some embodiments having the gap 440 sealed in the first electrode 410, the first electrode 410 is a multi-layer structure. In some embodiments, average grand sizes of the first layer 411' and the second layer 412' are different due to different deposition rate. In some embodiments, the average grain size of the first layer 411' is smaller than the average grand size of the second layer 412' of the first electrode 410 due to the lower deposition rate. In some embodiments, an interface or a boundary between the first layer 411' and the second layer 412' of the first electrode 410 can be observed under microscope.

Figure 13:
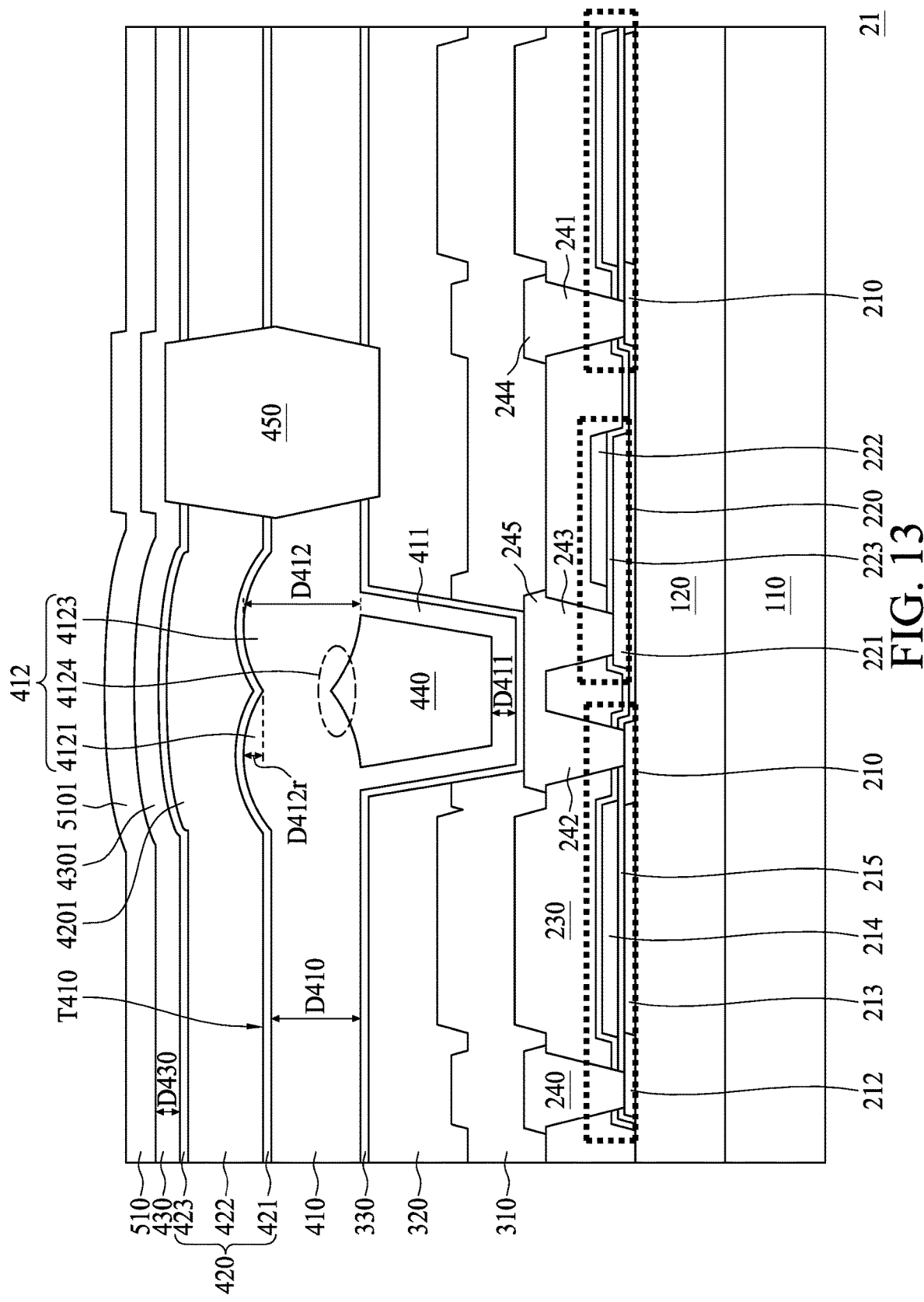

Referring to FIG. 13, a photodiode 420, a second electrode 430 and an anti-reflective layer 510 are subsequently formed over the first electrode 410. The photodiode 420, the second electrode 430 and the anti-reflective layer 510 are similar to those illustrated in FIG. 2, and repeated description is omitted herein. An optical sensor 21 similar to the optical sensor 20 is formed. In some embodiments, the optical sensor 21 further includes a layer of a micron lens array (not shown) formed over the anti-reflective layer 510 to further enhance light absorption.

Figure 14:
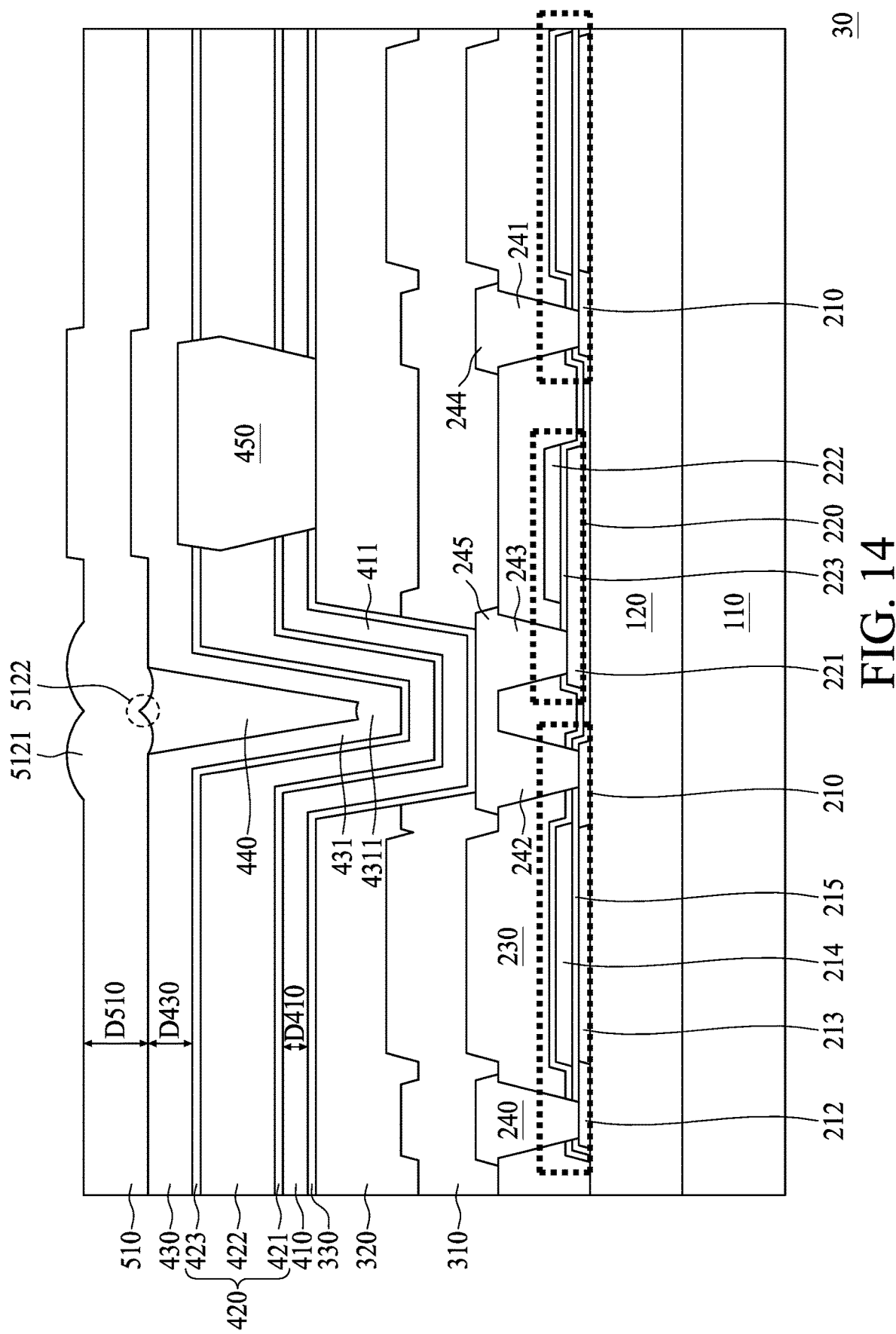
FIGS. 14 to 16 are cross-sectional diagrams of optical sensors in accordance with some embodiments of the present disclosure.

Under the same concepts, some embodiments of the present disclosure provide an optical sensor includes a gap between a second electrode and at least a portion of an anti-reflective layer. In some embodiments, an optical sensor 30 includes a gap 440 defined by a second electrode 430 and an anti-reflective layer 510 is provided as shown in FIG. 14. The gap is defined by the U-shaped first portion 431 of the second electrode 430 and the anti-reflective layer 510. As shown in FIG. 14, a deposition operation is performed to form anti-reflective layer 510, wherein the deposition operation has a high deposition rate, after the first deposition of the second electrode as illustrated in FIG. 8 and relevant paragraphs. One or more convex portions 5121, protruding away from the gap 440, are formed over the gap 440. In some embodiments, depending on the deposition rate, multiple convex portions 5121 are formed as shown in FIG. 14 at positions corresponding to the top edges E431 of the second electrode 430 as shown in FIG. 8. In some embodiments, one convex portion 5121 is formed directly over the gap 440 (not show). In order to form a micro lens structure of the anti-reflective layer 510, in some embodiments, a thickness D510 of the anti-reflective layer 510 is greater than or equal to 1000 nanometers. In some embodiments, the thickness D510 of the anti-reflective layer 510 is in a range of 1000 to 5000 nanometers.

Figure 15:
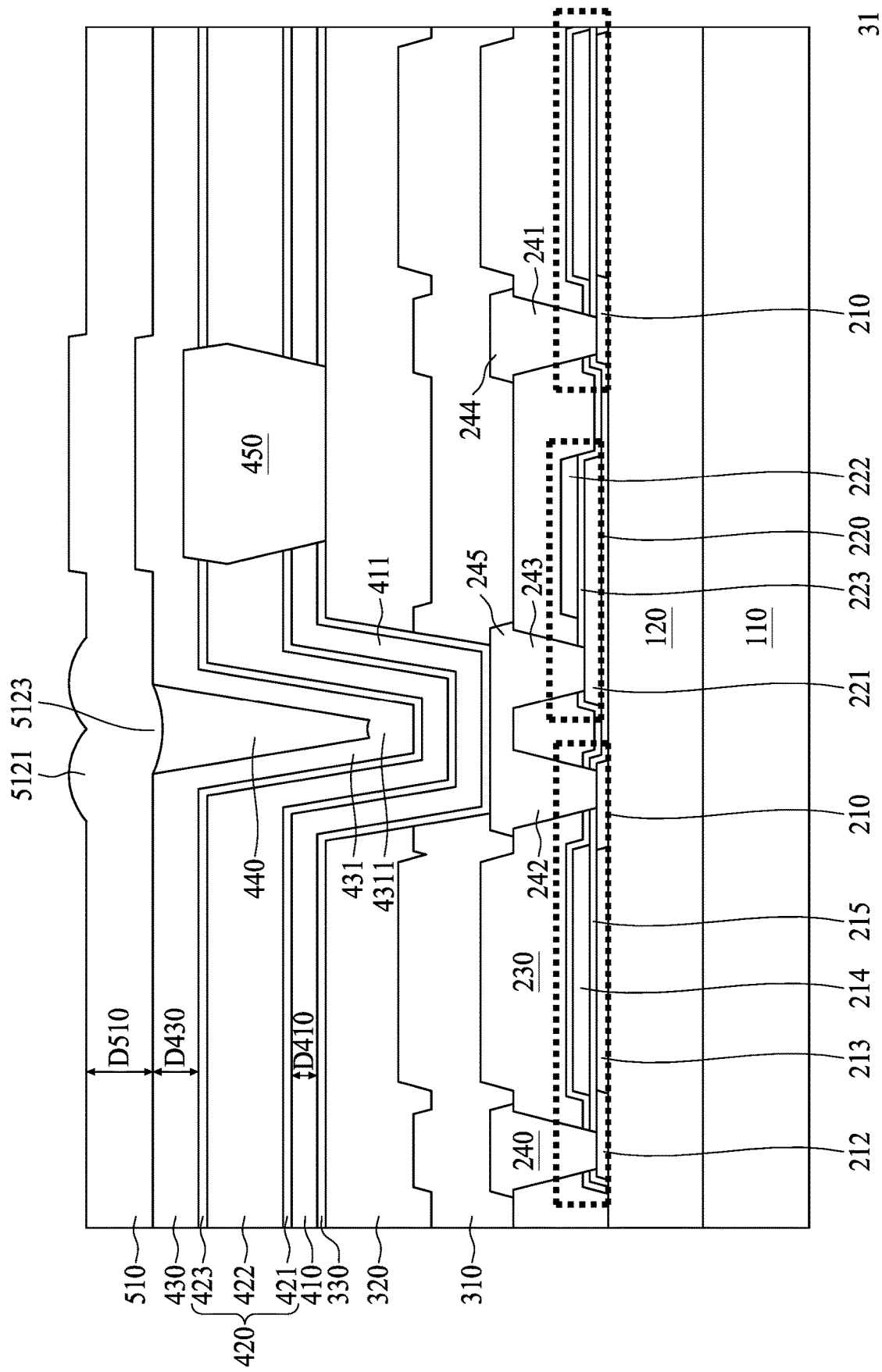

Depending on the deposition rate for forming the anti-reflective layer 510, the anti-reflective layer 510 may include a concave portion 5122 facing the gap 440 as shown in FIG. 14 of the optical sensor 30, or the anti-reflective layer 510 may include a convex portion 5123 protruding toward the gap 440 as shown in FIG. 15 of an optical sensor 31.

Figure 16:
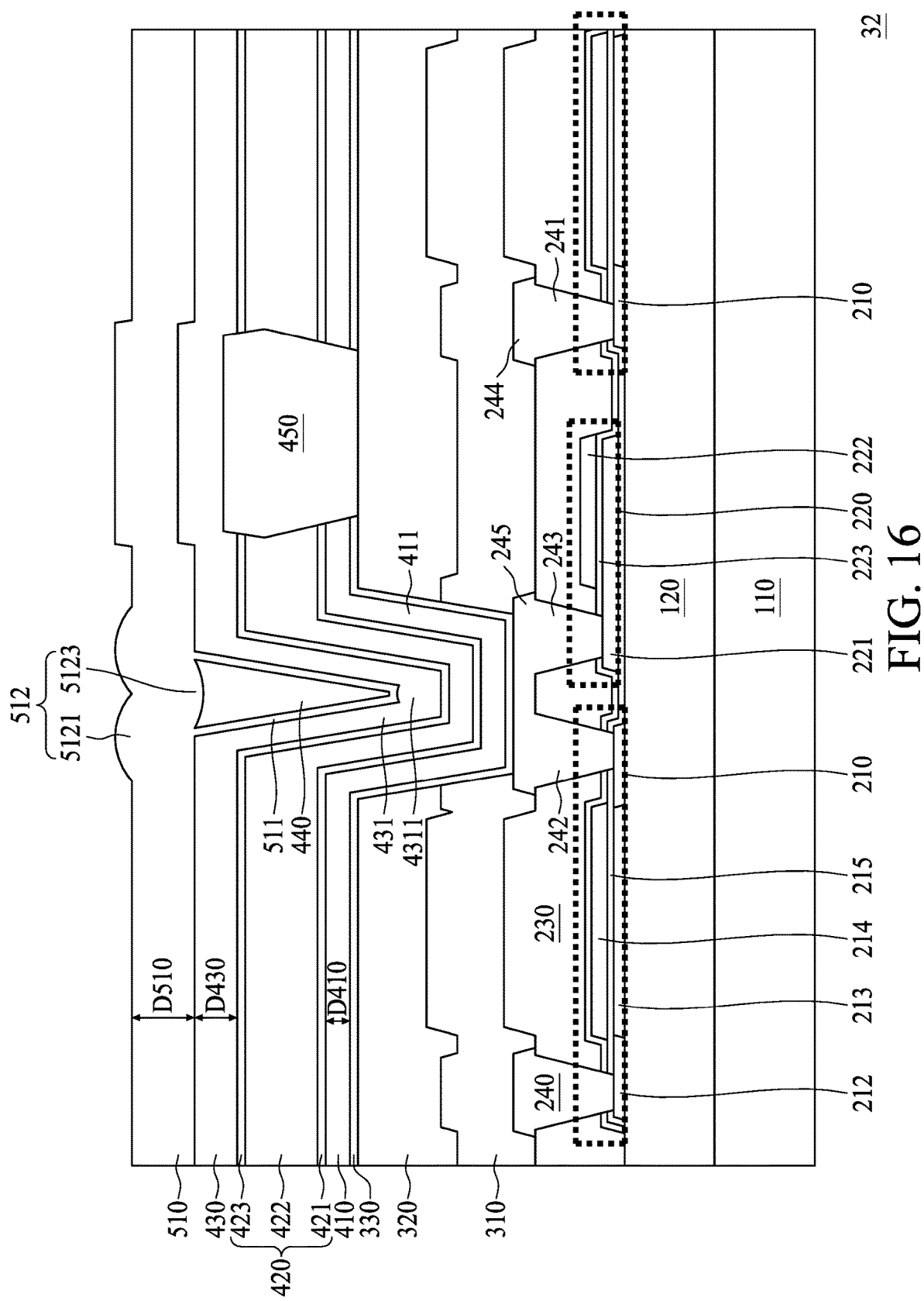

Referring to FIG. 16, in accordance with some embodiments of the present disclosure, an optical sensor 32 having a gap 440 sealed in an anti-reflective layer 510 is provided. Similar to the first deposition and second deposition of forming the second electrode 430 as illustrated in FIGS. 8 to 9 and relevant paragraphs, a first deposition with low deposition rate is performed to form a first portion 511 conformal to a second electrode 430, wherein the first portion 511 includes a U-shaped portion lining a U-shaped portion 431 of the second electrode 430 and a planar portion over a planar layer 320. A second deposition with high deposition rate is performed to form a second portion 512 capping the U-shaped portion of the first portion 511. The second portion 512 includes a planar portion over the planar portion of the first portion 511, and a cap portion including a convex portion 5121 and a convex portion 5123. In some embodiments, a concave portion 5122 is formed over the U-shaped portion of the first portion 511 of the anti-reflective layer 510 instead of the convex portion 5123 depending on the deposition rate. In some embodiments, a portion of the first portion 511 is adjacent to the gap 440 and conformal to a convex portion 4311 of the second electrode 430.

In some embodiments having the gap 440 sealed in the anti-reflective layer 510, the anti-reflective layer 510 is a multi-layer structure. In some embodiments, average grand sizes of the first portion 511 and the second portion 512 are different due to different deposition rate. In some embodiments, the average grain size of the first portion 511 is smaller than the average grand size of the second portion 512 of the anti-reflective layer 510 due to the lower deposition rate. In some embodiments, an interface or a boundary between the first portion 511 and the second portion 512 of the anti-reflective layer 510 can be observed under microscope.

Therefore, from an aspect of the present disclosure, an optical sensor is provided. The optical sensor includes a substrate, a transistor, a dielectric layer, a first electrode, a photodiode, a second electrode and a gap. The transistor is disposed over the substrate. The dielectric layer is disposed over the transistor. The first electrode is disposed over the dielectric layer and includes a U-shaped portion electrically connected to the transistor. The second electrode is disposed over the first electrode, and the photodiode is disposed between the first electrode and the second electrode. The gap is surrounded by the U-shaped portion of the first electrode and sealed by the first electrode or the second electrode.

From another aspect of the present disclosure, a method for forming an optical sensor is provided. The method includes following operations: (O11) receiving a semiconductor substrate having a connecting structure exposed through an opening; (O12) forming a first electrode over the semiconductor substrate, wherein at least a portion of the first electrode lines the opening; (O13) forming a photodiode over the first electrode; (O14) forming a second electrode over the photodiode; and (O15) forming an gap within the first electrode or the second electrode. The operation (O15) can be performed during the formation of the first electrode of the operation (O12), or during the formation of the second electrode of the operation (O14).

From another aspect of the present disclosure, an optical sensor is provided. The optical sensor includes: a substrate, a transistor, a dielectric layer, a first electrode, a photodiode, a second electrode, an anti-reflective layer and a gap. The transistor is disposed over the substrate. The dielectric layer is disposed over the transistor. The first electrode is disposed over the dielectric layer and includes a U-shaped portion electrically connected to the transistor. The second electrode is conformally disposed over the first electrode, and the photodiode is disposed between the first electrode and the second electrode. The gap is surrounded by the U-shaped portion of the first electrode and disposed between the second electrode and at least a portion of the anti-reflective layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical sensor, comprising:
    a substrate;
    a transistor, disposed over the substrate;
    a dielectric layer, disposed over the transistor;
    a first electrode, disposed over the dielectric layer, comprising a U-shaped portion electrically connected to the transistor;
    a second electrode, disposed over the first electrode;
    a photodiode, disposed between the first electrode and the second electrode; and
    a gap, surrounded by the U-shaped portion of the first electrode and sealed by the first electrode or the second electrode.

2. The optical sensor of claim 1, wherein the photodiode and a portion of the second electrode line the U-shaped portion of the first electrode, and the gap is sealed by the second electrode.

3. The optical sensor of claim 2, wherein the second electrode comprises:
    a first portion, lining the photodiode and the U-shaped portion of the first electrode; and
    a second portion, covering the first portion to seal the gap.

4. The optical sensor of claim 3, wherein a thickness of the second portion is greater than a thickness of the first portion of the second electrode.

5. The optical sensor of claim 3, wherein the second portion of the second electrode comprises a first convex portion over the gap and protruding away from the gap.

6. The optical sensor of claim 5, further comprising:
    an anti-reflective layer, disposed over the first convex portion of the second electrode.

7. The optical sensor of claim 5, wherein the second portion of the second electrode comprises a second convex portion over the gap, adjacent to the first convex portion, and protruding toward the gap.

8. The optical sensor of claim 2, wherein a thickness of the second electrode is greater than a thickness of the first electrode.

9. The optical sensor of claim 1, wherein the first electrode further comprises a cap portion covering the U-shaped portion, and the gap is sealed by the cap portion and the U-shaped portion of the first electrode.

10. The optical sensor of claim 8, wherein the cap portion of the first electrode comprises a concave portion over the gap and facing the gap.

11. The optical sensor of claim 8, wherein the cap portion of the first electrode comprises a convex portion over the gap and protruding away from the gap.

12. The optical sensor of claim 11, wherein the photodiode lines the first electrode and comprises a convex portion over the convex portion of the first electrode.

13. The optical sensor of claim 12, wherein the second electrode lines the photodiode and comprises a convex portion corresponding to the convex portion of the photodiode.

14. The optical sensor of claim 12, further comprising:
    an anti-reflective layer, lining the photodiode and comprising a convex portion over the convex portion of the photodiode.

15. The optical sensor of claim 9, wherein a thickness of the first electrode is greater than a thickness of the second electrode.

16. The optical sensor of claim 1, wherein the first electrode or the second electrode sealing the gap comprises a top surface facing away from the gap, and the top surface has a recessed portion overlapping the gap.

17. The optical sensor of claim 1, wherein the substrate comprises a flexible substrate.

18. A optical sensor, comprising:
    a substrate;
    a transistor, disposed over the substrate;
    a dielectric layer, disposed over the transistor;
    a first electrode, disposed over the dielectric layer, comprising a U-shaped portion electrically connected to the transistor;
    a second electrode, conformally disposed over the first electrode;
    a photodiode, disposed between the first electrode and the second electrode;
    an anti-reflective layer, disposed over the second electrode; and
    a gap, surrounded by the U-shaped portion of the first electrode and disposed between the second electrode and at least a portion of the anti-reflective layer.

19. The optical sensor of claim 18, wherein the gap is sealed in the anti-reflective layer.

20. The optical sensor of claim 18, wherein the gap is defined by the second electrode and the anti-reflective layer.

* * * * *